US012593660B2

(12) United States Patent
Yim et al.

(10) Patent No.: US 12,593,660 B2
(45) Date of Patent: Mar. 31, 2026

(54) METHOD OF MANUFACTURING SEMICONDUCTOR DEVICE

(71) Applicant: Samsung Electronics Co., Ltd., Suwon-si (KR)

(72) Inventors: Inbeom Yim, Suwon-si (KR); Jeongjin Lee, Suwon-si (KR); Seungyoon Lee, Suwon-si (KR); Chan Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 261 days.

(21) Appl. No.: 18/454,219

(22) Filed: Aug. 23, 2023

(65) Prior Publication Data

US 2024/0222201 A1 Jul. 4, 2024

(30) Foreign Application Priority Data

Dec. 28, 2022 (KR) ........................ 10-2022-0187701

(51) Int. Cl.
| | |
|---|---|
| *H01L 21/66* | (2006.01) |
| *G03F 1/70* | (2012.01) |
| *H01L 21/027* | (2006.01) |
| *H01L 21/3213* | (2006.01) |

(52) U.S. Cl.
CPC ................ *H01L 22/20* (2013.01); *G03F 1/70* (2013.01); *H01L 21/0274* (2013.01); *H01L 21/32139* (2013.01)

(58) Field of Classification Search
CPC ..... H01L 22/20; H01L 22/12; H01L 21/0274;

H01L 21/32139; H01L 21/32135; H01L 21/76865; H01L 23/544; H01L 2223/54426; G03F 1/70; G03F 7/70525; G03F 7/2004; G03F 7/705; G03F 7/70633
See application file for complete search history.

(56) References Cited

U.S. PATENT DOCUMENTS

| | | | | |
|---|---|---|---|---|
| 5,731,113 | A | * | 3/1998 | Ueno .................. G03F 7/70458 |
| | | | | 430/30 |
| 6,266,144 | B1 | | 7/2001 | Li |
| 7,788,061 | B2 | | 8/2010 | Takeuchi et al. |
| 9,188,876 | B2 | | 11/2015 | Lee et al. |
| 9,881,122 | B2 | | 1/2018 | Kathiresan et al. |
| 10,061,211 | B2 | | 8/2018 | Lee et al. |
| 10,409,168 | B2 | | 9/2019 | Danilin |

(Continued)

OTHER PUBLICATIONS https://en.wikipedia.org/wiki/Fr%C3%A9chet_inception_distance "Frechet inception distance".

*Primary Examiner* — Julio J Maldonado
*Assistant Examiner* — Alexander Michael Miller
(74) *Attorney, Agent, or Firm* — HARNESS, DICKEY & PIERCE, P.L.C.

(57) ABSTRACT

The method including forming a first photoresist (PR) pattern by exposing first field areas of a first PR layer, forming a second PR pattern by exposing first top field areas and first bottom field areas of a second PR layer, measuring a first top intra-field overlay for the first top field areas and a first bottom intra-field overlay for the first bottom field areas, and determining a top intra-field correction parameter and a bottom intra-field correction parameter based on the first top intra-field overlay and the first bottom intra-field overlay, respectively, may be provided.

20 Claims, 15 Drawing Sheets

(56)          References Cited

U.S. PATENT DOCUMENTS

| 10,642,161 | B1 | 5/2020 | Corliss et al. |
| 11,300,889 | B2 | 4/2022 | Van Dijk et al. |
| 2022/0244649 | A1 | 8/2022 | Smorenberg et al. |

* cited by examiner

Figure 1:
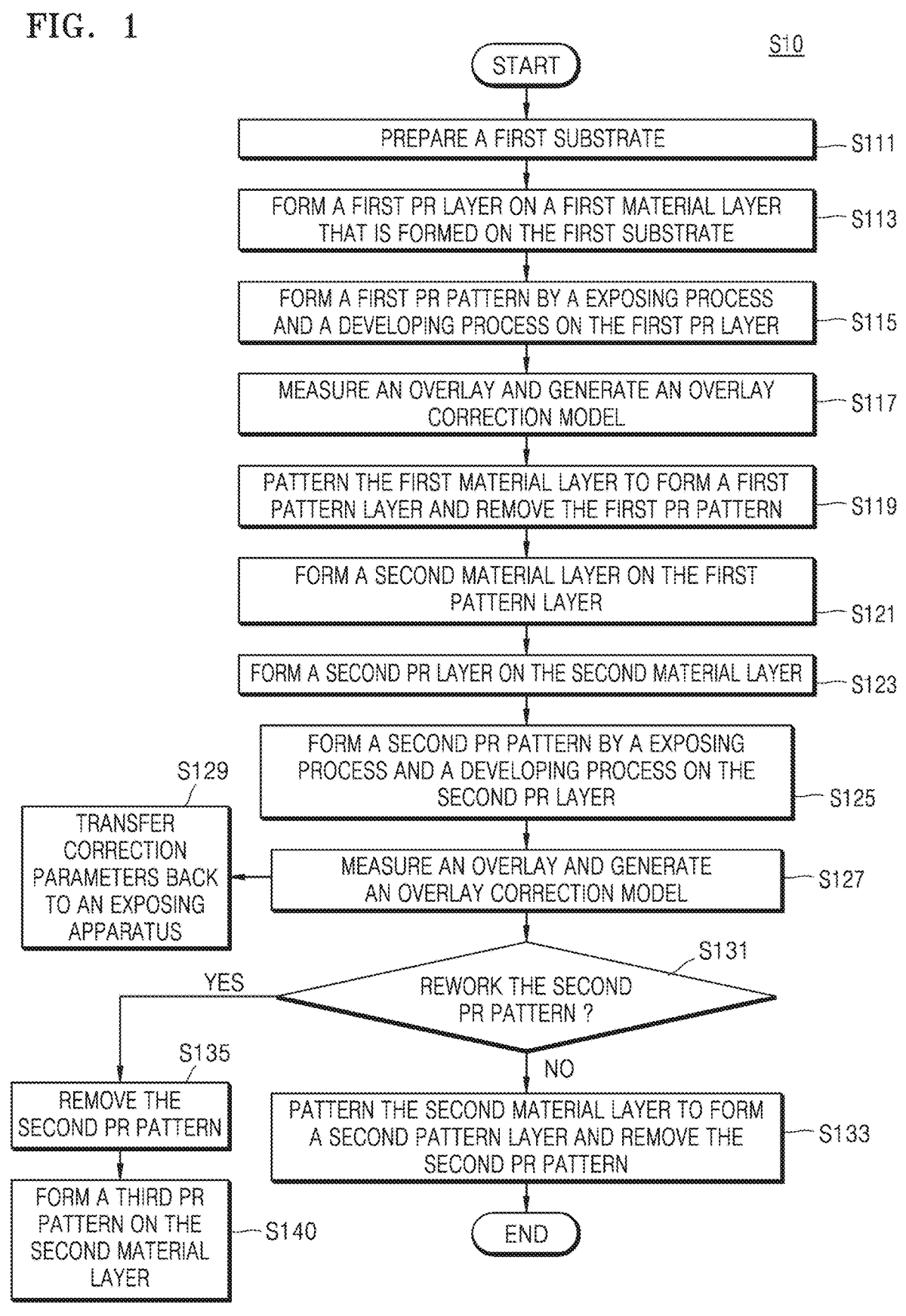

START

PREPARE A FIRST SUBSTRATE — S111

FORM A FIRST PR LAYER ON A FIRST MATERIAL LAYER THAT IS FORMED ON THE FIRST SUBSTRATE — S113

FORM A FIRST PR PATTERN BY A EXPOSING PROCESS AND A DEVELOPING PROCESS ON THE FIRST PR LAYER — S115

MEASURE AN OVERLAY AND GENERATE AN OVERLAY CORRECTION MODEL — S117

PATTERN THE FIRST MATERIAL LAYER TO FORM A FIRST PATTERN LAYER AND REMOVE THE FIRST PR PATTERN — S119

FORM A SECOND MATERIAL LAYER ON THE FIRST PATTERN LAYER — S121

FORM A SECOND PR LAYER ON THE SECOND MATERIAL LAYER — S123

FORM A SECOND PR PATTERN BY A EXPOSING PROCESS AND A DEVELOPING PROCESS ON THE SECOND PR LAYER — S125

S129
TRANSFER CORRECTION PARAMETERS BACK TO AN EXPOSING APPARATUS

MEASURE AN OVERLAY AND GENERATE AN OVERLAY CORRECTION MODEL — S127

S131
REWORK THE SECOND PR PATTERN ?

YES

NO

S135
REMOVE THE SECOND PR PATTERN

PATTERN THE SECOND MATERIAL LAYER TO FORM A SECOND PATTERN LAYER AND REMOVE THE SECOND PR PATTERN — S133

FORM A THIRD PR PATTERN ON THE SECOND MATERIAL LAYER — S140

END

FIG. 2B
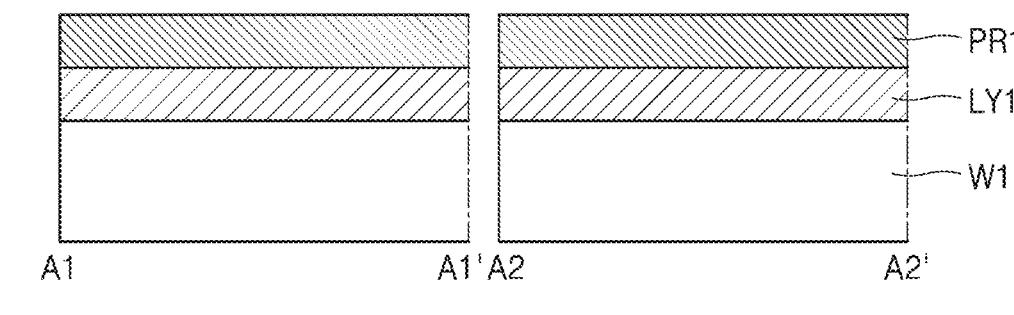
PR1
LY1
W1
A1                                A1'A2                                A2'
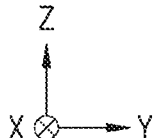

FIG. 2C
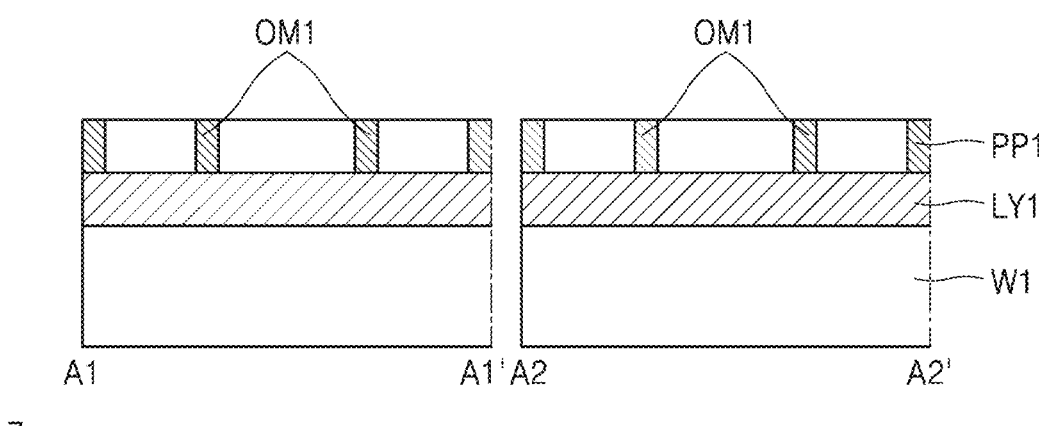
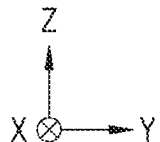

FIG. 4

FIG. 6
(Conventional Art)
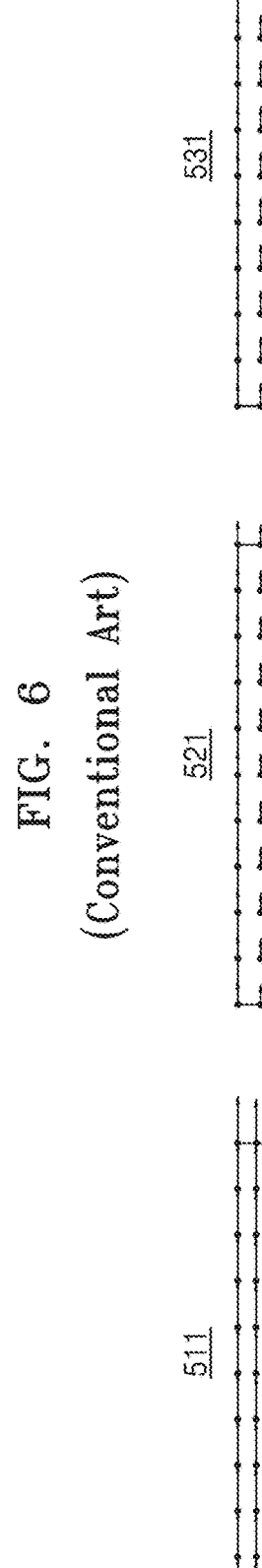
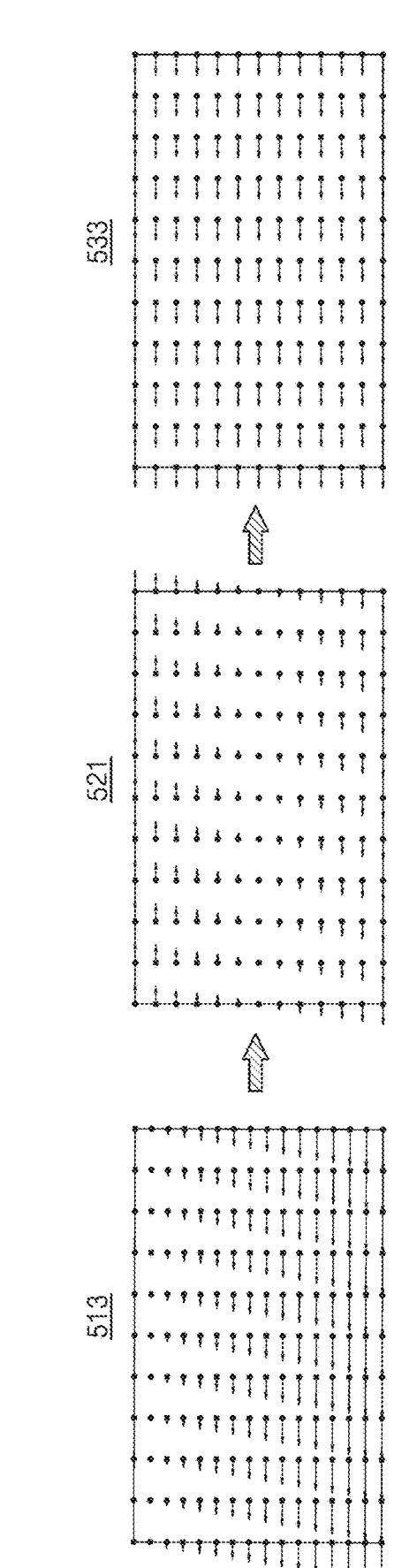

FIG. 7

METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2022-0187701, filed on Dec. 28, 2022, in the Korean Intellectual Property Office, the disclosure of which is incorporated by reference herein in its entirety.

BACKGROUND

The inventive concepts of the present disclosure relate to methods of manufacturing a semiconductor device.

With the recent size reduction in memory cell for high integration of information and communication devices, operating circuits and/or wiring structures in memory devices for operation and electrical connection of semiconductor devices have also been complicated. Accordingly, an extreme ultraviolet (EUV) lithography process has been increasingly applied in manufacture semiconductor devices. The EUV lithography, for example, is a lithography technology that uses light with a wavelength of about 4 nm to about 124 nm, preferably 13.5 nm, and enables ultra-fine dimensional processing of less than 20 nm (Sub-20 nm), which is difficult to implement with conventional ArF excimer laser. A feedback process including overlay measurement and analysis is one of the key factors for securing reliability of the EUV lithography process. Accordingly, various studies have been conducted for improving the accuracy and reliability of the overlay measurement.

SUMMARY

The inventive concepts of the present disclosure provide methods of manufacturing a semiconductor device.

According to an example embodiment, a method of manufacturing a semiconductor device includes sequentially forming a first material layer and a first photoresist (PR) layer on a first substrate, forming a first PR pattern on the first material layer by a first exposing process on the first PR layer in a first exposing apparatus, the first exposing process including exposing plurality of first field areas of the first PR layer, forming a first pattern layer by an etching process on the first material layer using the first PR pattern as an etching mask, sequentially forming a second material layer and a second PR layer on the first pattern layer, forming a second PR pattern on the second material layer by a second exposing process on the second PR layer in a second exposing apparatus, the second exposing process including exposing a plurality of first top field areas and a plurality of first bottom field areas of the second PR layer, the first top field areas vertically overlapping first portions of corresponding ones of the first field areas, respectively, and the first bottom field areas vertically overlapping second portions of corresponding ones of the first field areas, respectively, measuring a first top intra-field overlay for the first top field areas and a first bottom intra-field overlay for the first bottom field areas, determining a top intra-field correction parameter based on the first top intra-field overlay and a first top intra-field correction function, determining a bottom intra-field correction parameter based on the first bottom intra-field overlay and a first bottom intra-field correction function, feeding back the determined top intra-field correction parameter and the determined bottom intra-field correction parameter to the second exposing apparatus, inspecting the second PR pattern, selectively reworking the second PR pattern based on an inspection results, to form the semiconductor device.

According to an example embodiment, a method of manufacturing a semiconductor device includes forming a first layer on a first substrate, sequentially forming a second layer and a photoresist (PR) layer on the first layer, forming a PR pattern on the second layer by exposing top field areas and bottom field areas of the PR layer in a first exposing apparatus, the top field areas arranged in a first line in parallel with a first direction, the bottom field areas arranged in a second line in parallel with the first direction, the first line and the second line being spaced apart in a second direction perpendicular to the first direction, measuring a top intra-field overlay for the top field areas and a bottom intra-field overlay for the bottom field areas, determining a top intra-field correction parameter based on the top intra-field overlay and a bottom intra-field correction parameter based on the bottom intra-field overlay, feeding back the determined top intra-field correction parameter and the determined bottom intra-field correction parameter to the first exposing apparatus, inspecting the PR pattern, and selectively reworking the PR pattern based on an inspection result, to form the semiconductor device, wherein each of the top field areas has a first reduction ratio in the first direction and a second reduction ratio in the second direction with respect to a photomask of the first exposing apparatus, each of the bottom field areas has a first reduction ratio in the first direction and a second reduction ratio in the second direction with respect to the photomask of the first exposing apparatus, and the first reduction ratio and the second reduction ratio are different from each other.

According to an example embodiment, a method of manufacturing a semiconductor device includes sequentially forming a first material layer and a first photoresist (PR) layer on a first substrate, forming a first PR pattern by a first exposing process on the first PR layer in a first exposing apparatus, the first exposing process including exposing first field areas of the first PR layer, forming a first pattern layer by a first etching process on the first material layer using the first PR pattern as an etching mask, sequentially forming a second material layer and a second PR layer on the first pattern layer, forming a second PR pattern by a second exposing process on the second PR layer in a second exposing apparatus, the second exposing process including exposing a plurality of first top field areas and a plurality of first bottom field areas of the second PR layer, each of the first top field areas vertically overlapping first portions of corresponding ones of the first field areas, and each of the first bottom field areas vertically overlapping second portions of corresponding ones of the first field areas, respectively, forming a second pattern layer by a second etching process on the second material layer using the second PR pattern as an etching mask, the second pattern layer including second top field areas vertically overlapping the first top field areas and second bottom field areas vertically overlapping the first bottom field areas, measuring a top intra-field overlay for the second top field areas and a bottom intra-field overlay for the second bottom field areas, determining a top intra-field correction parameter based on the top intra-field overlay and a top intra-field correction function, determining a bottom intra-field parameter based on the bottom intra-field overlay and a bottom intra-field correction function, feeding back the determined top intra-field correction parameter and the determined bottom intra-field correction parameter to the second exposing apparatus, inspecting the second PR pattern, and selectively reworking the second PR pattern based on an inspection result, to form the semiconductor device.

BRIEF DESCRIPTION OF THE DRAWINGS

Example embodiments will be more clearly understood from the following detailed description taken in conjunction with the accompanying drawings in which:

FIG. 1 is a flowchart showing a method of manufacturing a semiconductor device, according to an example embodiment;

FIGS. 2A to 2I are views illustrating a method of manufacturing a semiconductor device, according to an example embodiment;

FIG. 4 is a view illustrating a second exposing apparatus, according to an example embodiment;

FIG. 6 is a view illustrating a process of treating overlay data in a method of manufacturing a semiconductor device, according to a comparative example; and FIG. 7 is a view illustrating a process of treating overlay data in a method of manufacturing a semiconductor device, according to an example embodiment.

DETAILED DESCRIPTION

Figure 2A:
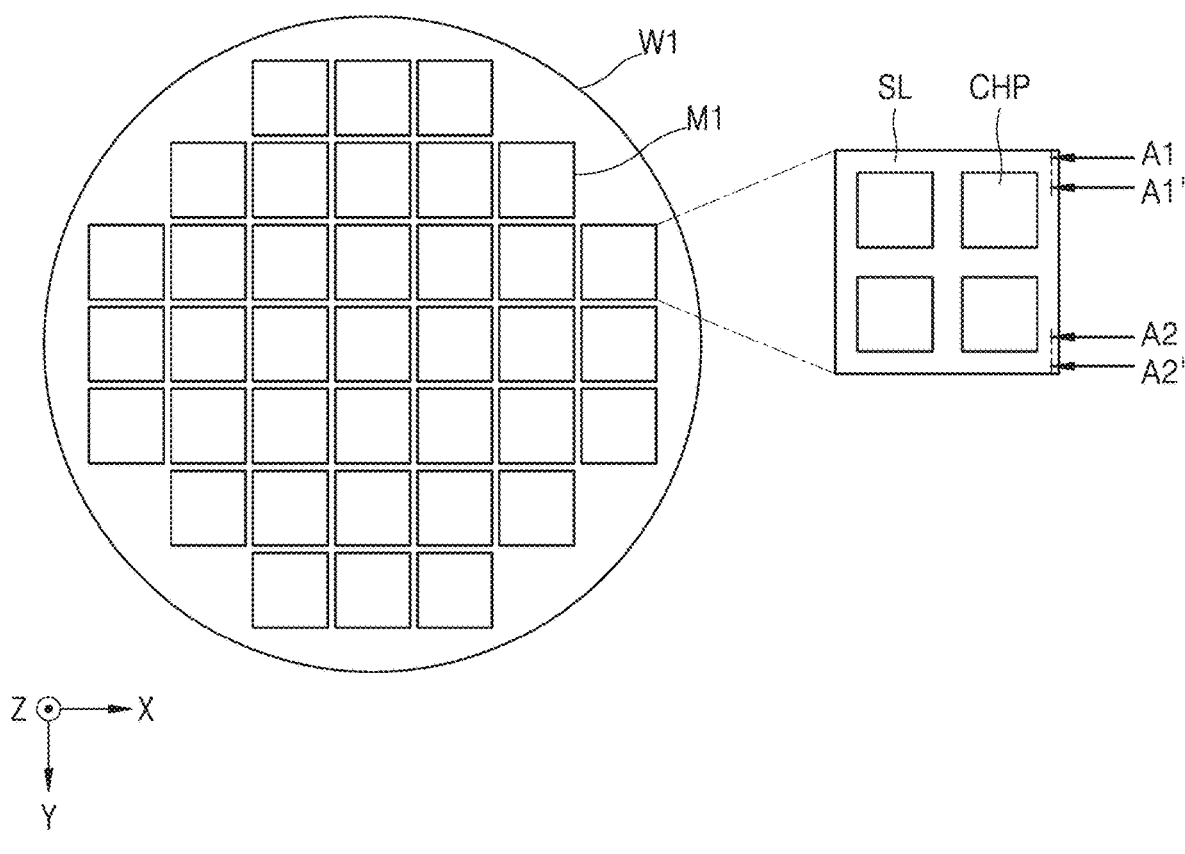

Hereinafter, some embodiments of the present inventive concepts will be described in detail with reference to the accompanying drawings. The same reference numerals denote the same elements in the drawings, and the descriptions on the same elements are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2D:
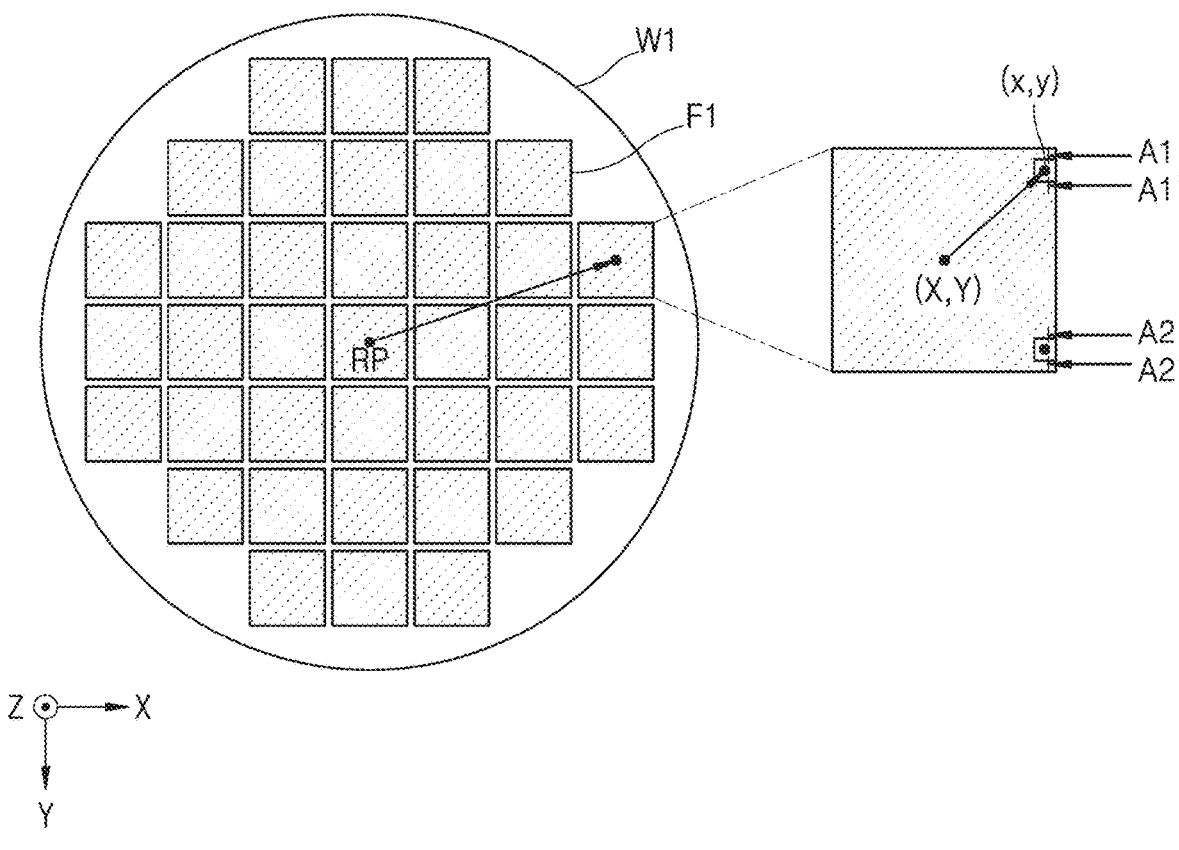

FIG. 1 is a flowchart showing a method of manufacturing a semiconductor device S10, according to an example embodiment. FIGS. 2A to 2I are views illustrating a method of manufacturing a semiconductor device, according to an example embodiment. FIGS. 2A, 2D, and 2H are plan views. FIGS. 2B, 2C, 2E, 2F, 2G, and 2I each show a cross-sectional view taken along line A1-A1' in FIG. 2A and a cross-sectional view taken along line A2-A2' in FIG. 2A.

Hereinafter, a method of manufacturing a semiconductor device is described in detail with reference to FIGS. 1 and 2A to 2I.

Referring to FIGS. 1 and 2A, a first semiconductor substrate W1 may be prepared (S111). The first semiconductor substrate W1 may include, for example, a wafer. The first semiconductor substrate W1 may include a plurality of chip areas CHP. Each of the chip areas CHP may be an area of the first semiconductor substrate W1, in which a plurality of circuit layouts for a semiconductor device overlaps each other, to provide a semiconductor chip. The plurality of chip areas CHP may be separated by a scribe lane SL extending in X and Y directions. In FIG. 2A, reference number M1 represents an area corresponding to a first field area F1 in FIG. 2D exposed by single-shot exposure in a first exposing process, which is described hereinafter. The X direction and the Y direction may be in parallel with an upper surface of the first semiconductor substrate W1, and more particularly, the X direction and the Y direction may be perpendicular to each other.

In some example embodiments, a memory device may be formed in each of the plurality of chip areas CHP and the memory device may include a nonvolatile memory device and a volatile memory device. For example, the nonvolatile memory device may include NAND flash memory, PRAM, MRAM, ReRAM, and FRAM. For example, the volatile memory device may include DRAM and SRAM.

In some example embodiments, any one of a logic device, a measuring device, a communication device, a digital signal processor (DSP), and a system-on-chip (SOC) may be formed in each chip area CHP.

Referring to FIGS. 1 and 2B, a first material layer LY1 and a first photoresist (PR) layer PR1 may be sequentially formed on the first semiconductor substrate W1 (S113).

In operation S113, the first material layer LY1 may include, for example, a metal. The first material layer LY1 may cover the first semiconductor substrate W1. For example, the first material layer LY1 may be formed by a plating process. Another material layer may be further positioned between the first semiconductor substrate W1 and the first material layer LY1.

In operation S113, the first PR layer PR1 may be formed by an adhesion promoting process and a spin coating process. The adhesion promoting process may include a process for bonding the first PR layer PR1 to the first semiconductor substrate W1 or a material layer provided on the first semiconductor substrate W1. The PR material may have a low adhesion with regard to the surface of silicon or silicon-containing material. Therefore, the adhesion promoting process may be performed on a surface of the first semiconductor substrate W1 (or the surface of the material layer provided on the first semiconductor substrate W1) before the first PR layer PR1 is formed on the first semiconductor substrate W1. For example, the adhesion promoting process may include surface treatment to the surface of the first semiconductor substrate W1 with hexamethyldisilazane (HMDS). The HMDS may make the surface of the first semiconductor substrate W1 hydrophobic, and thus, the adhesion may be reinforced between the PR material and the first semiconductor substrate W1.

The spin coating process may include a process of coating the PR material on the first semiconductor substrate W1. The PR material may include an organic polymer. Liquid PR material may be supplied onto the first semiconductor substrate W1 and the first semiconductor substrate W1 may be rotated at high speed, so that the first semiconductor substrate W1 is coated with the PR material. A thickness of the first PR layer PR1 may be uniform by the spin rotation of the first semiconductor substrate W1.

Referring to FIGS. 1, 2B, and 2C, after forming the first PR layer PR1, an exposing process and a developing process may be sequentially performed on the first PR layer PR1, to thereby form a first PR pattern PP1 (S115).

Figure 3:
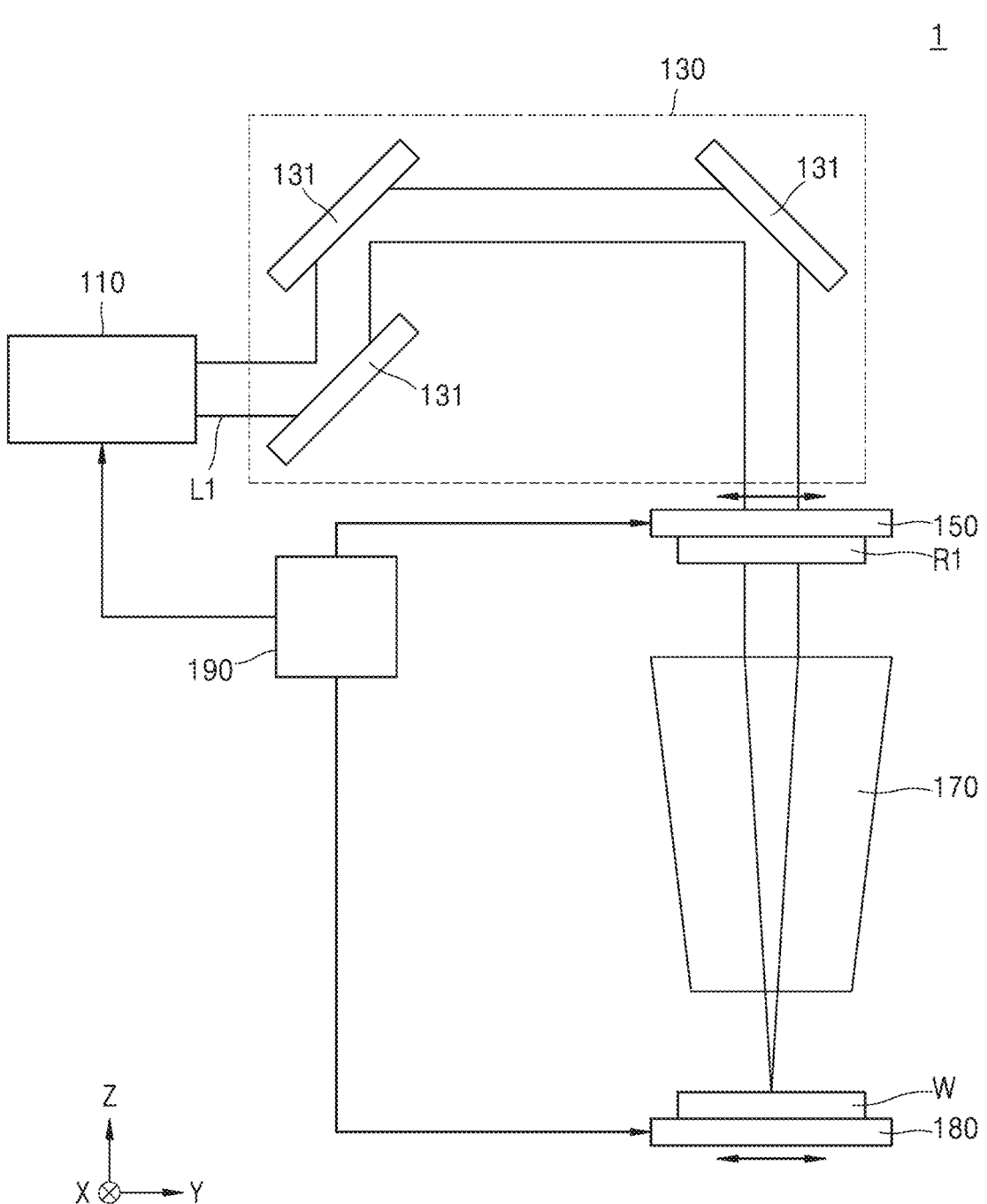
FIG. 3 is a view illustrating a first exposing apparatus, according to an example embodiment.

In operation S115, the first exposing process may be performed on the first field areas F1 of the first PR layer PR1 in a first exposing apparatus 1 in FIG. 3. Each first field area F1 is an area on which an image of the entire circuit pattern of a first photomask R1 in FIG. 3 is transferred in the first exposing apparatus 1. In the first exposing process, each first field area F1 of the first PR layer PR1 may be exposed by single-shot exposure. Each first field area F1 may have the same field size in view of a length in the X direction and a length in the Y direction. The first field areas F1 may be arranged on the first semiconductor substrate W1 in the X direction and the Y direction. The first photomask may also be referred to as first reticle.

The circuit pattern of the first photomask may be transferred onto the plurality of first field areas F1 of the first PR layer in the first exposing process by using a deep ultraviolet (DUV) radiation beam and/or a low numerical aperture (NA) extreme UV (EUV) radiation beam. Herein, the low numerical aperture (low NA) may include a numerical aperture less than about 0.35, and a high numerical aperture (high NA) described below may include a numerical aperture more than or equal to about 0.35. For example, the low numerical aperture may be about 0.33, and the high numerical aperture may be about 0.55.

In the first exposing process, the circuit pattern of the first photomask R1 may be reduced to 1:1 or a certain reduction ratio and transferred to the first field areas F1 of the first PR layer PR1. In some example embodiments, in the first exposing process, the X-direction reduction ratio between the X-direction length of the first photomask R1 and the X-direction length of the first field area F1 may be the same as or substantially similar to the Y-direction reduction ratio between the Y-direction length of the first photomask R1 and the Y-direction length of the first field area F1. In some example embodiments, in the first exposing process, the X-direction reduction ratio and the Y-direction reduction ratio may be 1/N (N is a natural number)y. In some example embodiments, in the first exposing process, the X-direction reduction ratio and the Y-direction reduction ratio may be about 1/4.

In operation S115, after performing the first exposing process on the first PR layer PR1, the developing process may be performed on the first PR layer PR1. At least an exposed area of the first PR layer PR1 may be removed by the developing process to the first PR layer PR1. The first PR pattern PP1 may be formed from the first PR layer PR1 by the developing process to the first PR layer PR1. The first PR pattern PP1 may have a first overlay mark OM1.

Referring to FIGS. 1, 2C, and 2D, after forming the first PR pattern PP1, an overlay may be measured, and an overlay correction model may be generated (S117).

The overlay measurement may include an operation of measuring an overlay error that indicates a deviation between a current layer, which is formed in the current operation, and a lower layer, which is formed in the previous operation, by using a measuring apparatus. Hereinafter, the overlay error is collectively referred to as overlay.

In some example embodiments, the first overlay mark OM1 of the first PR pattern PP1 may include an image-based overlay (IBO) mark. For example, the first overlay mark OM1 of the first PR pattern PP1 may have a box-in-box structure. The measuring apparatus may obtain images of the first semiconductor substrate W1 by using an optical device or a camera and may measure the overlay by performing a signal processing for extracting the IBO marks from the obtained images.

In some example embodiments, the first overlay mark OM1 of the first PR pattern PP1 may include a diffraction-based overlay (DBO) mark. Incident light incident onto the DBO mark is diffracted from the DBO mark and the diffracted light may be detected, and then the overlay may be measured by performing a signal processing to the diffracted light.

The second to fourth overlay marks OM2, OM3, and OM4 may include an IBO mark or a DBO mark, as described in detail hereinafter.

The overlay measurement for the first PR pattern PP1 may be performed by using the first overlay mark OM1 of the first PR pattern PP1. In some example embodiments, the overlay measurement for the first PR pattern PP1 may include an operation of detecting the first overlay mark OM1 of the first PR pattern PP1 and another overlay mark of the lower layer under the first PR pattern PP1, and an operation of calculating the relative position between the first overlay mark OM1 and the overlay mark of the lower layer. In some example embodiments, when the first PR pattern PP1 is a lowermost layer, the overlay measurement for the first PR pattern PP1 may include an operation of detecting the first overlay mark OM1 of the first PR pattern PP1 and a reference mark, and an operation of calculating the relative position between the first overlay mark OM1 and the reference mark. The reference mark may be positioned on the first semiconductor substrate W1 or positioned on a substrate stage on which the first semiconductor substrate W1 is mounted.

The overlay measurement may include an operation of measuring an intra-field overlay for each of the first field areas F1 of the first PR pattern PP1 and an operation of measuring an inter-field overlay between the first field areas F1 of the first PR pattern PP1.

In performing the overlay measurement, a field coordinate of each first field area F1 may be defined as a distance between a reference point RP on the first semiconductor substrate W1 and a center of the first field area F1. For example, the reference point RP may be set as a center of the first semiconductor substrate W1 and may be indicated by (0,0). Thus, the field coordinate of the first field area F1 may be indicated by (X, Y). In addition, the intra-field coordinate of each first field area F1 may be defined as a distance from a center of the corresponding first field area F1. The intra-field coordinates for a specific point of each first field area F1 may be expressed as (x, y). In addition, the inter-field overlay may indicate a deviation between the first field areas F1 on the first semiconductor substrate W1, and the intra-field overlay may indicate a deviation within each first field area F1.

The intra-field overlay may be expressed as the intra-field coordinates of the first field area F1. The intra-field overlay may include a zero-degree component, a first-degree linear component, and a second or more degree non-linear component.

For example, the zero-degree component may include K1 and K2 components. The K1 component may include a parallel transition parameter in the X direction, and the K2 component may include a parallel transition parameter in the Y direction. The K1 component may be represented in the form of $dx=K1$ and the K2 component may be represented in the form of dy=K2. The zero-degree component may be included in a linear component.

The first-degree linear component may include K3 to K6 components. The K3 component may include an isotropic expansion parameter in the X direction, the K4 component may include an isotropic expansion parameter in the Y direction, the K5 component may include a rotation parameter with respect to the X direction, and the K6 component may include a rotation parameter with respect to the Y direction. The K3 component may be represented in the form of dx=K3*x, and the K4 component may be represented in the form of dy=K4*y. In addition, the K5 component may be represented as dx=K5*y, and the K6 component may be represented as dy=K6*x.

The second-degree nonlinear component may include K7 to K12 components. The K7 to K12 components may include parameters proportional to the square of the position. The K7 component may be represented in the form of $dx=K7*x^2$, and the K8 component may be represented in the form of $dy=K8*y^2$. In addition, the K9 component may be represented as dx=K9*x*y, the K10 component may be represented as dy=K10*y*x, the K11 component may be represented as $dx=K11*y^2$, and the K12 component may be represented in the form of $dy=K12*x^2$.

The third-degree nonlinear component may include K13 to K20 components. The K13 to K20 components may include parameters proportional to a cube of the position. The K13 component may be represented in the form of $dx=K13*x^3$, and the K14 component may be represented in the form of $dy=K14*y^3$. In addition, the K15 component may be represented as $dx=K15*x^2*y$, the K16 component may be represented as $dy=K16*y^2*x$, the K17 component may be represented as $dx=K17*x*y^2$, the K18 component may be represented as $dy=K18*y*x^2$, the K19 component may be represented as $dx=K19*y^3$, and the K20 component may be represented as $dy=K20*x^3$.

In operation S117, the overlay correction model may be generated based on the overlay measurement results. The generating of the overlay correction model may include an operation of generating an overlay correction function and an operation of determining a correction parameter based on a value of the overlay measurement and the overlay correction function (e.g., by comparing a value of the overlay measurement with the overlay correction function).

The overlay correction function may be generated by fitting a polynomial function based on the parameters of the intra-field overlay (e.g., K1 to K20). The overlay correction function may include an intra-field correction function FX related to X-axis components of the overlay and an intra-field correction function FY related to Y-axis components of the overlay. Each of the intra-field correction functions FX and FY may be represented as a polynomial function of which the highest degree is a third degree.

$$FX = K1 + K3*x + K5*y + K7*x^2 + K9*xy +$$
$$K11*y^2 + K13*x^3 + K15*x^2y + K17*xy^2 + K19*y^3$$
$$FY = K2 + K4*y + K6*x + K8*y^2 + K10*xy +$$
$$K12*x^2 + K14*y^3 + K16*xy^2 + K18*x^2y + K20*x^3$$

Based on the value of the overlay measurement and the overlay correction function (e.g., by comparing the value of the overlay measurement with the overlay correction function), contributions of the intra-field overlay parameters (e.g., K1 to K20) for the entire overlay may be detected. The value of the overlay measurement may include an average overlay, which is an average value of overlay values obtained from the first field areas F1 of the first PR pattern PP1. The average overlay value at a specific coordinate may be an average of the overlay values measured at a specific coordinate of the first field areas F1. The comparing of the value of the overlay measurement with the overlay correction function (e.g., the detecting contributions of the intra-field overlay parameters (e.g., K1 to K20) for the entire overlay Based on the value of the overlay measurement and the overlay correction function) may include an operation of determining a residual, which is the difference between the value of the overlay measurement (or the average overlay value) and the overlay correction function, and operation of determining regression coefficients (e.g., intra-field overlay parameters), which minimize the sum of the squares of the above residuals or the sum of the above residuals, by using a regression analysis technique. The intra-field overlay parameters, which are determined in the previous process, may be fed back to the first exposing apparatus, to thereby correct the first exposing process. The operation S117 may be performed by an advanced process controller or an advanced process controlling system. The advanced controller or an advanced process controlling system may perform various functions including functions not discussed herein and may include processing circuitry to implement the various functions. The advanced controller or an advanced process controlling system may operate based on instructions stored in a memory or may operate based on preprogrammed functions.

Figure 2E:
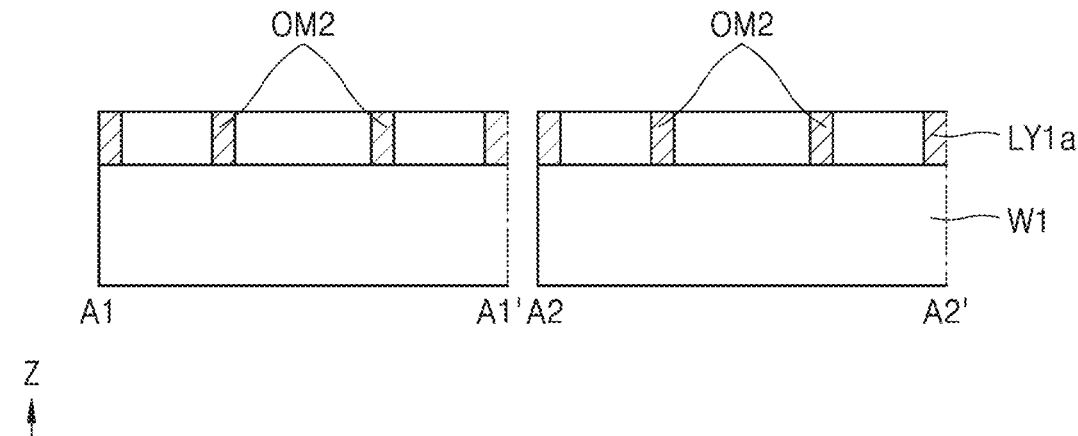

Referring to FIGS. 1 and 2E, the first material layer LY1 may be patterned by using the first PR pattern PP1 in FIG. 2C as a mask, to form a first pattern layer LY1a, and the first PR pattern PP1 may be removed from the first pattern layer LY1a (S119). In operation S119, an etching process may be performed on the first material layer LY1 by using the first PR pattern PP1 as an etching mask, to thereby form the first pattern layer LY1a from the first material layer LY1. The first pattern layer LY1a may include a second overlay mark OM2. In addition, the first PR pattern PP1 may be removed by a strip process.

Figure 2F:
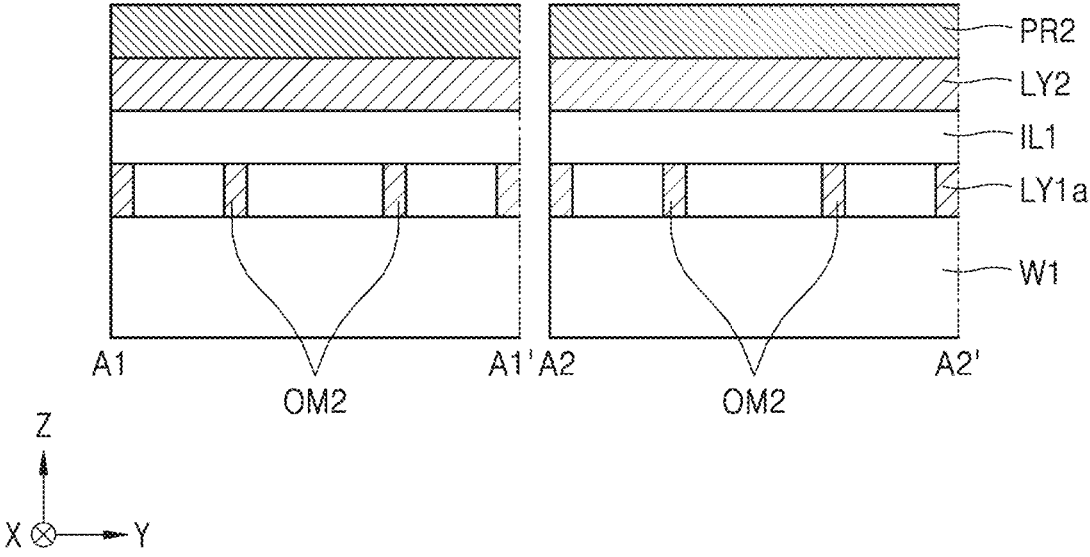

Referring to FIGS. 1 and 2F, after forming the first pattern layer LY1a, a first insulating layer IL1 may be formed on the first pattern layer LY1a in such way that the first pattern layer LY1a is covered with the first insulating layer IL1, and then, a second material layer LY2 may be formed on the first insulating layer (S121). The second material layer LY2 may include, for example, metal. The second material layer LY2 may be formed by, for example, a plating process. After forming the second material layer LY2, a second PR layer PR2 may be formed on the second material layer LY2 (S123). The operation of forming the second PR layer PR2 may include an adhesion promoting process and a spin coating process.

Figure 2G:
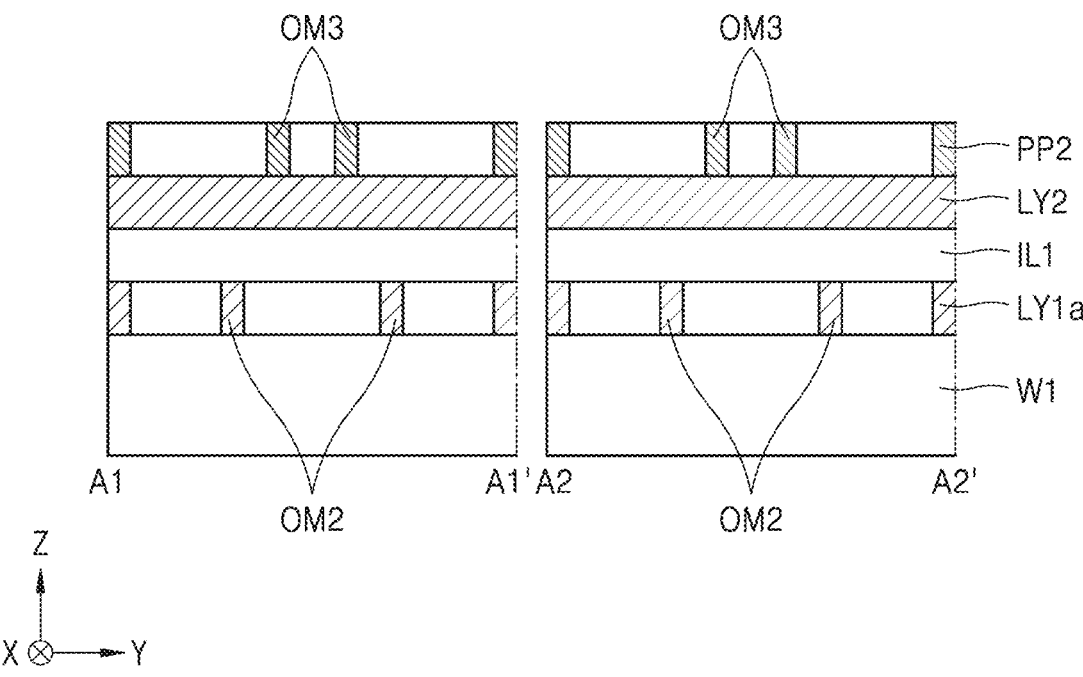
Figure 2H:
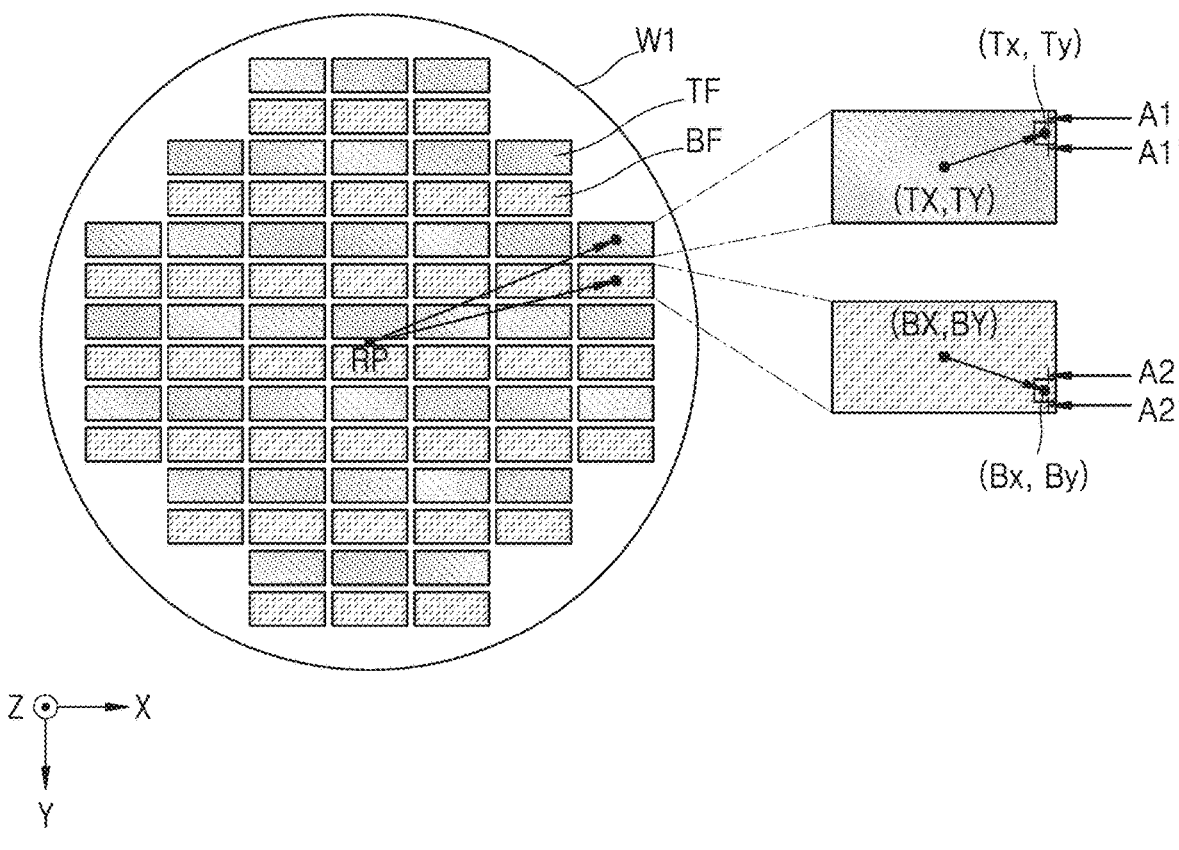

Referring to FIGS. 1, 2F, and 2G, after forming the second PR layer PR2, an exposing process and a developing process may be sequentially performed on the second PR layer PR2, to thereby form a second PR pattern PP2 (S125).

Figure 4:
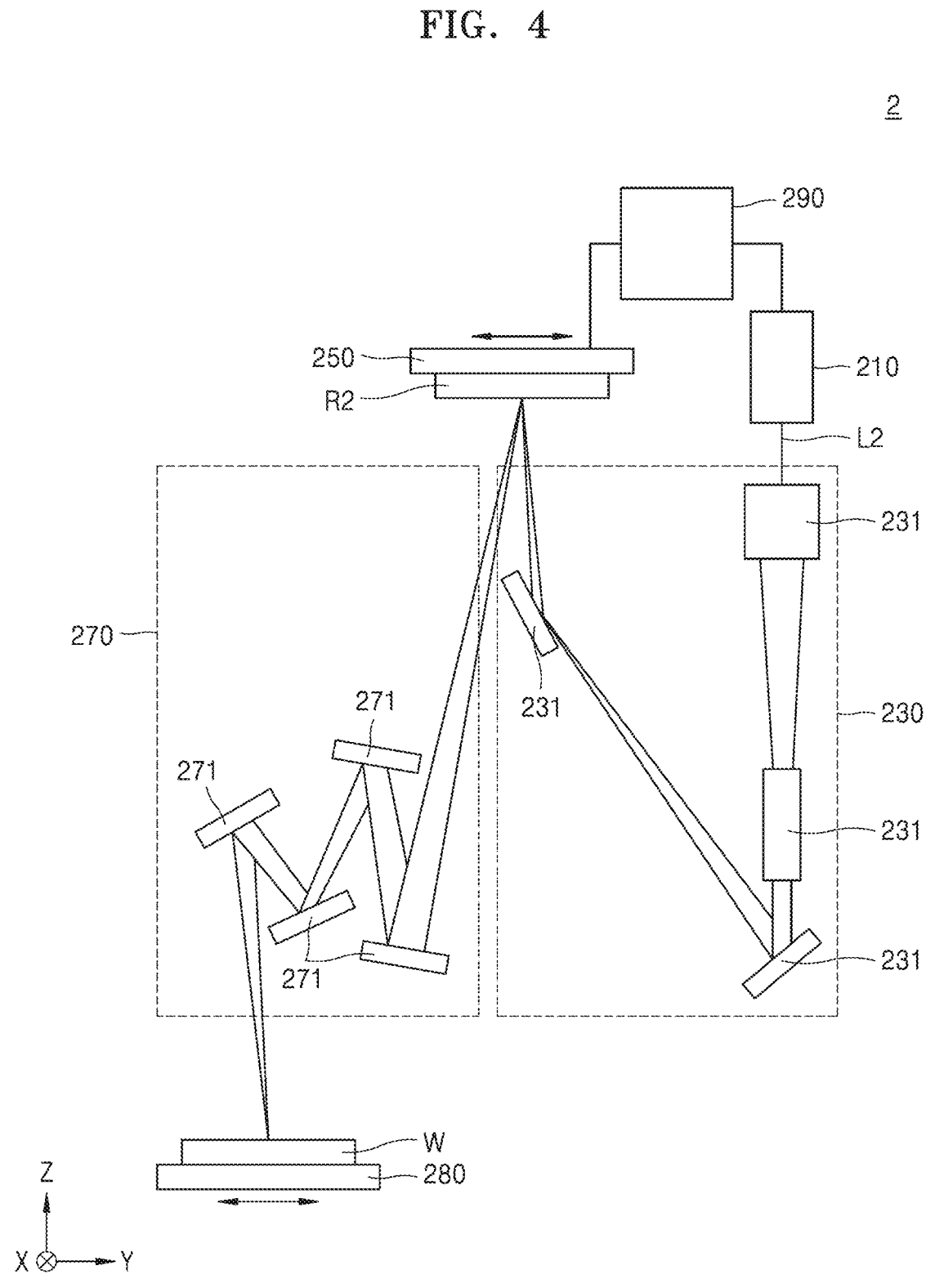

In operation S125, a second exposing process may be performed on the second PR layer PR2 in a second exposing apparatus 2 in FIG. 4, and thus, first top field areas TF and first bottom field areas BF of the second PR layer PR2 may be exposed by the second exposing apparatus 2. The second exposing apparatus may be different from the first exposing apparatus 1 in FIG. 3, which is used to perform the first exposing process on the first PR layer PR1. The first top field areas TF and the first bottom field areas BF may be exposed in different exposing steps in the second exposing apparatus. In the second exposing process, the first top field areas TF of the second PR layer PR2 may be exposed by top single-shot exposure, and the first bottom field areas BF of the second PR layer PR2 may be exposed by bottom single-shot exposure. Each first top field area TF is an area on which an image of the entire circuit pattern of a second photomask R2 in FIG. 4 is transferred in the second exposing apparatus, and each first bottom field area BF is an area on which an image of the entire circuit pattern of a second photomask R2 in FIG. 4 is transferred in the second exposing apparatus. The second photomask R2 may be referred to as second reticle.

The first top field areas TF may be arranged in the X direction, the first bottom field areas BF may be arranged in the X direction, and each first top field area TF and a corresponding first bottom field area BF may be adjacent to each other in the Y direction. The first top field areas TF may be arranged along a first line in parallel with the X direction, the first bottom field areas BF may be arranged along a second line in parallel with the X direction, and the first line and the second line may be spaced apart in the Y direction.

Each of the first top field areas TF may vertically overlap a first portion of a corresponding first field area (F1 of FIG. 2D), and each of the first bottom field areas BF may vertically overlap a second portion of the corresponding first field area F1. In each first field area F1, the first portion and the second portion may not overlap each other. The field size of each first top field area TF may be the same as that of each first bottom field area BF. That is, a length of each first top field area TF in the X direction may be the same as that of each first bottom field area BF in the X direction, and the length of each first top field area TF in the Y direction may be the same as that of each first bottom field area BF.

The second exposing process may include an EUV exposing process using an EUV radiation beam. The wavelength of light provided to the second photomask R2 in the second exposing process may be smaller than that of light provided to the first photomask R1 in the first exposing process. In some example embodiments, the first exposing process may be a process in which a low numerical aperture EUV radiation beam or a DUV radiation beam is used, and the second exposing process may be a process in which a high numerical aperture EUV radiation beam is used.

The EUV exposing process may be performed by a scanning method. The EUV exposing process may be performed by using a slit for limiting an irradiation area of the EUV radiation beam to a partial area of the second photomask R2. While the EUV radiation beam is irradiated to the limited partial area of the second photomask R2 through the slit, the second photomask R2 may move in a direction perpendicular to a longitudinal direction of the slit, so that the EUV radiation beam is continuously irradiated or scanned to the second photomask R2 in the direction along which the second photomask R2 moves. The longitudinal direction of the slit may be the X direction, and the scanning direction of the second photomask R2 may be the Y direction.

In the second exposing process, the X-direction reduction ratio between the X-direction length of the second photomask R2 and the X-direction length of the field area (e.g., the first top field area TF or the first bottom field area BF) may be different from the Y-direction reduction ratio between the Y-direction length of the second photomask R2 and the Y-direction length of the field area (e.g., the first top field area TF or the first bottom field area BF). In some example embodiments, the Y-direction reduction ratio may be greater than the X-direction reduction ratio in the second exposing process. In some example embodiments, when the X-direction reduction ratio is 1/N (N is a natural number) and the Y-direction reduction ratio is 1/M (M is a natural number), M may be greater than N in the second exposing process. In some example embodiments, the X-direction reduction ratio may be 1/4 and the Y-direction reduction ratio may be 1/8 in the second exposing process. In some example embodiments, the second exposing process may be an anamorphic reduction projection in which the X-direction reduction ratio and the Y-direction reduction ratio are different.

In operation S125, after performing the second exposing process on the second PR layer PR2, the developing process may be performed on the second PR layer PR2. At least an exposed area of the second PR layer PR2 may be removed by the developing process. The second PR layer PR2 may be formed into the second PR pattern PP2 by the developing process. The second PR pattern PP2 may include a third overlay mark OM3.

Referring to FIGS. 1, 2G, and 2H, after forming the second PR pattern PP2, an overlay may be measured, and an overlay correction model may be generated (S127).

In operation S127, the overlay measurement for the second PR pattern PP2 may include an operation of detecting the third overlay mark OM3 of the second PR pattern PP2 and the second overlay mark OM2 of the first pattern layer LY1a and an operation of calculating the relative position between the third overlay mark OM3 of the second PR pattern PP2 and the second overlay mark OM2 of the first pattern layer LY1a.

The overlay measurement may include an operation of measuring a top intra-field overlay for each of the first top field areas TF of the second PR pattern PP2, an operation of measuring a bottom intra-field overlay for each of the first bottom field areas BF of the second PR pattern PP2, and an operation of measuring an inter-field overlay between the field areas of the second PR pattern PP2 (e.g., the first top field areas TF and the first bottom field areas BF).

In performing the overlay measurement, the field coordinates of each first top field area TF may be represented as (TX, TY), and the field coordinates of each first bottom field area BF may be represented as (BX, BY). The intra-field coordinates of the first top field areas TF may be represented as (Tx, Ty) and the intra-field coordinates of the first bottom field areas BF may be represented as (Bx, By).

The top intra-field overlay may be expressed as the intra-field coordinates in the first top field area TF, and the bottom intra-field overlay may be expressed as the intra-field coordinates in the first bottom field area BF. Each of the top intra-field overlay and the bottom intra-field overlay may include a zero-degree component, a first-degree linear component, and a second or more-degree non-linear component. The top intra-field overlay may include TK1 to TK20 components, and the TK1 to TK20 components may be the same kinds of parameters as the K1 to K20 described above, respectively. The bottom intra-field overlay may include BK1 to BK20 components, and each of the BK1 to BK20 components may be the same kinds of parameters as the K1 to K20 described above, respectively.

In operation S127, the overlay correction model may be generated based on the overlay measurement results. The generation the overlay correction model may include an operation of generating a top intra-field correction function, an operation of generating a bottom intra-field correction function, an operation of determining a top intra-field correction parameter based on the measured top intra-field overlay and the top intra-field correction function (e.g., by comparing the measured top intra-field overlay with the top intra-field correction function), and an operation of determining a bottom intra-field correction parameter based on the measured bottom intra-field overlay and the bottom intra-field correction function (by comparing the measured bottom intra-field overlay with the bottom intra-field correction function).

The top intra-field correction function may be generated by fitting a polynomial function using the top intra-field overlay parameters (e.g., TK1 to TK20). The top intra-field correction function may include a first top intra-field correction function TFX related to the X-axis components of the overlay and a second top intra-field correction function TFY related to the Y-axis components of the overlay. The first and second top intra-field correction functions TFX and TFY each may be represented as a polynomial function in which the highest degree is a third degree.

$$TFX = TK1 + TK3*(Tx) + TK5*(Ty) + TK7*(Tx)^2 +$$
$$TK9*(Tx)*(Ty) + TK11*(Ty)^2 + TK13*(Tx)^3 +$$
$$TK15*(Tx)^2*(Ty) + TK17*(Tx)*(Ty)^2 + TK19*(Ty)^3$$
$$TFY = TK2 + TK4*(Ty) + TK6*(Tx) + TK8*(Ty)^2 +$$
$$TK10*(Tx)*(Ty) + TK12*(Tx)^2 + TK14*(Ty)^3 +$$
$$TK16*(Tx)*(Ty)^2 + TK18*(Tx)^2*(Ty) + TK20*(Tx)^3$$

Based on the top intra-field overlay and the top intra-field correction function (e.g., by comparing the top intra-field overlay with the top intra-field correction function), the contribution of the top intra-field overlay parameters (e.g., TK1 to TK20) for the entire top intra-field overlay may be detected. The measured top intra-field overlay may include an average overlay value, which is an average value of the overlay values obtained from the first top field areas TF of the second PR pattern PP2. The average overlay value at a specific coordinate may be an average of the overlay values measured at a specific coordinate of the first top field areas TF. The overlay values obtained from the first bottom field areas BF of the second PR pattern PP2 may not be considered in generating the top intra-field correction function. The comparing of the measured top intra-field overlay with the top intra-field correction function (e.g., the detection of the contribution of the top intra-field overlay parameters for the entire top intra-field overlay based on the top intra-field overlay and the top intra-field correction function) may include an operation of determining a residual, which is the difference between the top intra-field overlay and the top intra-field correction function, and an operation of determining regression coefficients (e.g., the top intra-field overlay parameters), which minimize the sum of the squares of the above residuals or the sum of the above residuals, by using a regression analysis technique. The regression coefficient(s), which is determined by the regression analysis for the top intra-field correction function, is the top intra-field correction parameter(s) that is fed back to the second exposing apparatus.

The bottom intra-field correction function may be generated by fitting a polynomial function using the bottom intra-field overlay parameters (e.g., BK1 to BK20). The bottom intra-field correction function may include a first bottom intra-field correction function BFX related to the X-axis components of the overlay and a second bottom intra-field correction function BFY related to the Y-axis components of the overlay. The first and second bottom intra-field correction functions BFX and BFY may be represented as a polynomial function in which the highest degree is a third degree, respectively.

$$BFX = BK1 + BK3*(Bx) + BK5*(By) + BK7*(Bx)^2 +$$
$$BK9*(Bx)*(By) + BK11*(By)^2 + BK13*(Bx)^3 +$$
$$BK15*(Bx)^2*(By) + BK17*(Bx)*(By)^2 + BK19*(By)^3$$
$$BFY = BK2 + BK4* + BK6*(Bx) + BK8*(By)^2 +$$
$$BK10*(Bx)*(By) + BK12*(Bx)^2 + BK14*(By)^3 +$$
$$BK16*(Bx)*(By)^2 + BK18*(Bx)^2*(By) + BK20*(Bx)^3$$

Based on the bottom intra-field overlay and the bottom intra-field correction function (e.g., by comparing the bottom intra-field overlay with the bottom intra-field correction function), the contribution of the bottom intra-field overlay parameters (e.g., BK1 to BK20) for the entire bottom intra-field overlay may be detected. The measured bottom intra-field overlay may include an average overlay value, which is an average value of overlay values obtained from the first bottom field areas BF of the second PR pattern PP2 The average overlay value at a specific coordinate may be an average of overlay values measured at a specific coordinate of the first bottom field areas BF. The overlay values obtained from the first top field areas TF of the second PR pattern PP2 may not be considered in generating the bottom intra-field correction function. The comparing of the measured bottom intra-field overlay with the bottom intra-field correction function (e.g., the detection of the contribution of the bottom intra-field overlay parameters for the entire bottom intra-field overlay based on the bottom intra-field overlay and the bottom intra-field correction function) may include an operation of determining a residual, which is the difference between the bottom intra-field overlay and the bottom intra-field correction function, and an operation of determining regression coefficients (e.g., the bottom intra-field overlay parameters), which minimize the sum of the squares of the above residuals or the sum of the above residuals, by using a regression analysis technique. The regression coefficient(s), which is determined by the regression analysis for the bottom intra-field correction function, is the bottom intra-field correction parameter(s) that is fed back to the second exposing apparatus.

The operation S127 may be performed by an advanced process controller or an advanced process controlling system. The advanced controller or an advanced process controlling system may perform various functions including functions not discussed herein and may include processing circuitry to implement the various functions. The advanced controller or an advanced process controlling system may operate based on instructions stored in a memory or may operate based on preprogrammed functions.

The top intra-field correction parameters and the bottom intra-field correction parameters, which are determined in operation S127, may be fed back to the second exposing apparatus (S129). The second exposing apparatus 2 may perform another exposing process on the first semiconductor substrate W1 or another semiconductor substrate based on the top intra-field correction parameters and the bottom intra-field correction parameters.

Referring to FIGS. 1 and 2G, the second PR pattern PP2 may be inspected, and it is determined whether to rework the second PR pattern PP2 based on the inspection results (S131). For example, the dimensions of the features in the second PR pattern PP2, the consistency between the second PR pattern PP2 and the lower layer, and defects of the second PR pattern PP2 may be inspected when inspecting the second PR pattern PP2.

Figure 2I:
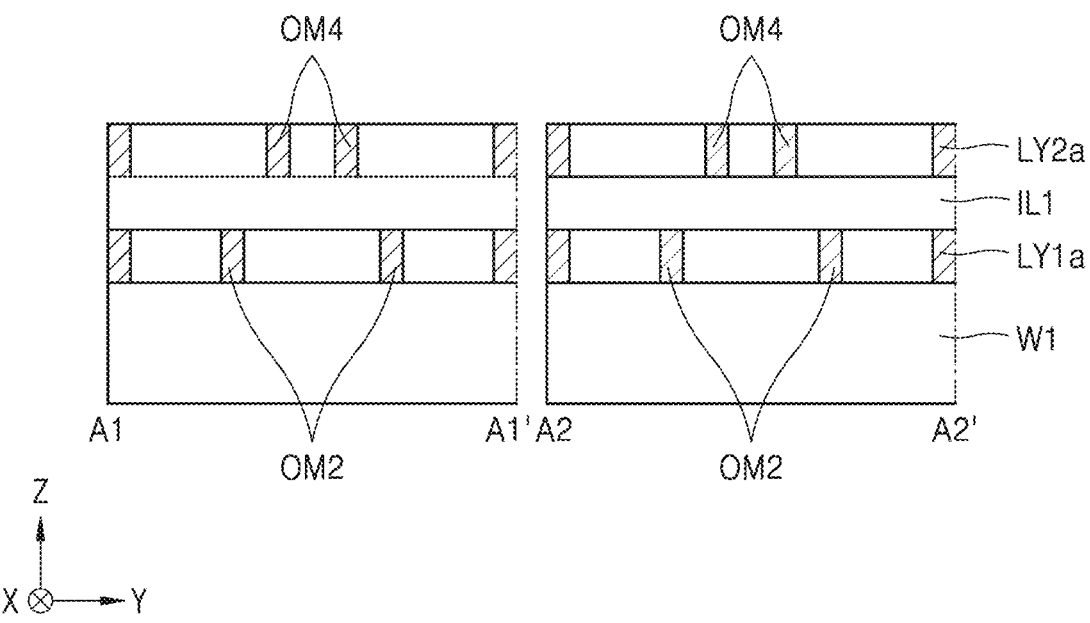

In operation S131, when the rework of the second PR pattern PP2 is not desired, the second material layer LY2 in FIG. 2G may be patterned into a second pattern layer LY2*a* in FIG. 2I, and then, the second PR pattern PP2 may be removed (S133). In operation S133, the second pattern layer LY2*a* may be formed from the second material layer LY2 by an etching process using the second PR pattern PP2 as an etching mask. Thereafter, the second PR pattern PP2 may be removed by a strip process.

Otherwise, in operation 131, when the rework of the second PR pattern PP2 is desired, the second PR pattern PP2 may be removed (S135).

After removing the second PR pattern PP2, a third PR pattern may be formed on the second material layer LY2 (S140). The forming of the third PR pattern may include an operation of forming a third PR layer on the second material layer LY2 the same as or substantially similar to operation S123, an operation of performing an exposing process and a developing process on the third PR layer the same as or substantially similar to operation S125, and an operation of performing overlay measurement the same as or substantially similar to operation S127.

A third exposing process for the third PR pattern may be performed by the second exposing apparatus. In the third exposing process, each of the second top field areas of the third PR layer may be exposed by top single-shot exposure, and each of the second bottom field areas of the third PR layer may be exposed by bottom single-shot exposure. Each second top field area of the third PR layer may overlap a corresponding first top field area TF among the first top field areas TF of the second PR layer PR2, and each second bottom field area overlap a corresponding first bottom field area BF among first bottom field areas BF of the second PR layer PR2.

In the third exposing process, the second exposing apparatus may perform the third exposing process on the third PR layer based on the top intra-field correction parameter and the bottom intra-field correction parameter that are determined in operation S127. The third exposing process may include checking the target positions of target exposing areas of the third PR layer and performing the top single-shot exposure or the bottom single-shot exposure according to the checked target positions. That is, when the checked position of the target exposing area of the third PR layer is in the second top field area of the third PR layer, the second exposing apparatus may perform the top single-shot exposure on the second top field area of the third PR layer based on the top intra-field correction parameter, which is determined in operation S127, in the second exposing apparatus. When the checked position of the target exposing area of the third PR layer is in the second bottom field area of the third PR layer, the second exposing apparatus may perform the bottom single-shot exposure on the second bottom field area of the third PR layer based on the bottom intra-field correction parameter, which is determined in operation S127, in the second exposing apparatus.

In some example embodiments, when the semiconductor device is manufactured on a second semiconductor substrate different from the first semiconductor substrate, an exposing process may be performed on a material layer on the second semiconductor substrate based on the top intra-field correction parameter and the bottom intra-field correction parameter, which are determined in operation S127, in the second exposing apparatus. The method of manufacturing a semiconductor device on the second semiconductor substrate may be the same as or substantially similar to the method of manufacturing a semiconductor device S10 on the first semiconductor substrate W1. For example, the method of manufacturing a semiconductor device on the second semiconductor substrate may include an operation of sequentially forming a third material layer and a fourth PR layer on the second semiconductor substrate, an operation of forming a fourth PR pattern by performing an exposing process and a developing process on the fourth PR layer, an operation of forming a third pattern layer by patterning the third material layer using the fourth PR pattern as an etching mask, an operation of removing the fourth PR pattern, an operation of forming a fourth material layer and a fifth PR layer on the third pattern layer, an operation of forming a fifth PR pattern by performing an exposing process and a developing process on the fifth PR layer, and an operation of forming a fourth pattern layer by patterning the fourth material layer using the fifth PR pattern as an etching mask. The exposing process on the third PR layer may be performed by the first exposing apparatus, and the exposing process on the fourth PR layer may be performed by the second exposing apparatus.

In the fourth exposing process on the fourth PR layer, the fourth PR layer may be exposed based on the top intra-field correction parameter and the bottom intra-field correction parameter that are determined in operation S127 in the second exposing apparatus. The fourth exposing process may include checking the target positions of target exposing areas of the fourth PR layer and performing the top single-shot exposure or the bottom single-shot exposure according to the checked target positions. That is, when the checked position of the target exposing area of the fourth PR layer is in a third top field area of the fourth PR layer, the second exposing apparatus may perform the top single-shot exposure on the third top field area of the fourth PR layer based on the top intra-field correction parameter, which is determined in operation S127, in the second exposing apparatus. When the checked position of the target exposing area of the fourth PR layer is in a third bottom field area of the fourth PR layer, the second exposing apparatus may perform the bottom single-shot exposure on the third bottom field area of the fourth PR layer based on the bottom intra-field correction parameter, which is determined in operation S127, in the second exposing apparatus.

FIG. 3 is a view illustrating a first exposing apparatus 1, according to an example embodiment.

Referring to FIG. 3, the first exposing apparatus 1 may include a light source 110, a transmission optical system 130, a projection optical system 170, and a control unit (or alternatively, controller or processor) 190. The light source 110 may include, for example, a laser source for generating a laser having a central wavelength of about 150 nm to 500 nm. The light source 110 may include an excimer laser source for generating a KrF laser or an ArF laser. For example, the light source 110 may generate an ArF laser having a central wavelength of about 193 nm.

The transmission optical system 130 may transmit a first light L1 generated from the light source 110 to the first photomask R1. The transmission optical system 130 may include a plurality of optical elements 131 for guiding the first light L1 to the first photomask R1 and the optical elements 131 may include lenses and mirrors.

The first photomask R1 may be provided on the mask stage 150. The first photomask R1 may include, for example, a transmissive mask. Although not shown in FIG. 3, the first photomask R1 may be supported on the mask stage 150 by, for example, three clamps, and the three clamps may be positioned at an edge portion of the first photomask R1. The mask stage 150 may include a material through which the first light L1 generated from the light source 110 may transmit.

The projection optical system 170 may focus the first light L1, which passes through the mask stage 150 and the first photomask R1, on an area of the substrate W. The projection optical system 170 may include, for example, a plurality of focusing lenses. The focusing lenses of the projection optical system 170 may reduce the first light L1, which has passed through the first photomask R1, at a certain magnification ratio (e.g., 4 times, 6 times, or 8 times), and the reduced first light L1 may be projected onto the substrate W.

A substrate W may be provided on the substrate stage 180. The substrate W may include a wafer on which an integrated circuit is formed The substrate W may be a semiconductor wafer including at least one of silicon, germanium, or silicon-germanium or a compound semiconductor wafer. An upper surface of the substrate W may be coated with a PR material that is sensitive to the first light L1, so that the PR layer may be formed on the substrate W.

The PR layer may be exposed to the first light L1 and a developing process may be performed on the exposed PR layer, to thereby form a PR pattern on the substrate W. A material layer under the PR pattern may be patterned by an etching process using the PR pattern as an etching mask, to thereby form a pattern layer from the material layer.

The control unit 190 may be connected to the light source 110, the mask stage 150, and the substrate stage 180, and may control the light source 110, the mask stage 150, and the substrate stage 180. For example, the control unit 190 may control driving motors coupled to the mask stage 150 and the substrate stage 180, respectively. The mask stage 150 and the substrate stage 180 may move in the X direction and/or the Y direction by the driving motor. The X direction may include a direction in which a slit for defining a target exposing area extends, and the Y direction may include a scan direction. In addition, the mask stage 150 and the substrate stage 180 may be rotated clockwise or counter-clockwise by the driving motor. The control unit 190 may perform various functions including functions not discussed herein and may include processing circuitry to implement the various functions. The control unit 190 may operate based on instructions stored in a memory or may operate based on preprogrammed functions.

FIG. 4 is a view illustrating a second exposing apparatus 2, according to an example embodiment.

Referring to FIG. 4, the second exposing apparatus 2 may include a light source 210, a transmission optical system 230, a projection optical system 270 and a control unit (or alternatively, controller or processor) 290. The light source 210 may include, for example, a beam source for generating a beam having a central wavelength of about 4 nm to about 120 nm, and for example, of about 4 nm to about 20 nm. For example, the light source 210 may generate an extreme ultra-violet (EUV) beam having a central wavelength of about 13.5 nm. A second light L2 generated from the light source 210 may have an energy of about 6.21 eV to about 124 eV, and more particularly, about 90 eV to about 95 eV.

The light source 210 of the second exposing apparatus 2 may include, for example, a plasma source using laser produced plasma (LPP). Although not shown in FIG. 4, the light source 210 of the second exposing apparatus 2 may include a vacuum chamber having a seed laser for emitting a pulse laser, at least a power amplifier for amplifying the laser, a target generator for generating targets at regular intervals, and a target collector for collecting targets.

The target may include a material that emits extreme ultraviolet light when the material such as tin (Sn), lithium (Li), or xenon (Xe) is converted into plasma. When including tin (Sn), the targets may include pure tin (Sn), a tin compound (e.g., $SnBr_4$, $SnBr_2$, $SnH_4$, etc.), and a tin alloy (e.g., a tin-gallium alloy, a tin-indium alloy, a tin-indium-gallium alloy, etc.). The targets may be in the form of, for example, droplets, streams, or clusters.

The pulse laser, which is emitted from the seed laser and passes through the power amplifier, may be irradiated to the targets moving from the target generator to the target collector, and thus, the targets may be converted into plasma by the pulse laser and the extreme ultraviolet light (e.g., second light L2) may be emitted from the targets.

The transmission optical system 230 may transmit the second light L2 generated from the light source 210 to the second photomask R2. The transmission optical system 230 may include a plurality of optical elements 231 for guiding the second light L2 to the second photomask R2, and the optical elements 231 may be lenses or mirrors. The optical elements 231 of the transmission optical system 230 may guide the second light L2 to be obliquely incident on the second photomask R2.

The second photomask R2 may be provided on the mask stage 250. The second photomask R2 may be, for example, a reflective mask. Although not shown in FIG. 4, the second photomask R2 may be supported on the mask stage 250 by, for example, a plurality of clamps, and the plurality of clamps may be positioned on an entire rear surface of the second photomask R2 at regular intervals. The mask stage 250 may include a material reflecting the second light L2 generated from the light source 210.

The projection optical system 270 may transmit the second light L2, which is reflected from the mask stage 250 and the second photomask R2, to an area of the substrate W. The projection optical system 270 may include a plurality of optical elements 271 for guiding the second light L2 to an area of the substrate W, and the optical elements 271 may be lenses or mirrors. The optical elements 271 of the projection optical system 270 may reduce the second light L2, which is reflected from the second photomask R2, to a certain magnification ratio (e.g., 4 times, 6 times, or 8 times) and the reduced second light L1 may be projected onto the substrate W.

The substrate W may be provided on the substrate stage 280. The substrate stage 280 may support the substrate W. An upper surface of the substrate W may be coated with a PR material that is sensitive to the second light L2, so that the PR layer may be formed on the substrate W.

The PR material, which is sensitive to the second light L2 such as an EUV light having a central wavelength of about 13.5 nm, may include an organic PR material having an organic polymer such as polyhydroxystyrene. The organic PR material may further include a photosensitive compound reacting with the second light L2. The organic PR material may further include a material having a high absorption rate for the second light L2, such as an organometallic material, an iodine-containing material, and a fluorine-containing material. In another example embodiment, the PR material may include an inorganic PR material having an inorganic material such as tin oxide.

The PR material may be formed on the substrate W with a relatively thin thickness. A developing process may be performed on the PR layer exposed to the second light L2, to thereby form a PR pattern. From a plan view, the PR pattern may include a line shape extending in a direction, an island shape, a zigzag shape, a honeycomb shape, and/or a circle shape, but the present inventive concepts are not limited thereto.

A material layer under the PR pattern may be patterned by an etching process using the PR pattern as an etching mask, to thereby pattern the material layer. In contrast, the material layer under the mask pattern may also be patterned by an etching process using the mask pattern as an etching mask, to thereby form a pattern layer patterned from the material layer. For example, a minimal pitch of the pattern layer, which is formed by the second exposing apparatus 2, may be about 45 nm or less.

The control unit 290 may be connected to the light source 210, the mask stage 250, and the substrate stage 280, and may control the light source 210, the mask stage 250, and the substrate stage 280. For example, the control unit 290 may control driving motors coupled to the mask stage 250 and the substrate stage 280, respectively. The mask stage 250 and the substrate stage 280 may move in the X direction and/or the Y direction by the driving motor. In addition, the mask stage 250 and the substrate stage 280 may be rotated clockwise or counterclockwise by the driving motor. In some example embodiments, the control unit 290 may control the light source 210, the mask stage 250, and/or the substrate stage 280 based on the top intra-field correction parameter and the bottom intra-field correction parameter that are determined in operation S127 in FIG. 1. The control unit 190 may perform various functions including functions not discussed herein and may include processing circuitry to implement the various functions. The control unit 190 may operate based on instructions stored in a memory or may operate based on preprogrammed functions.

Figure 5:
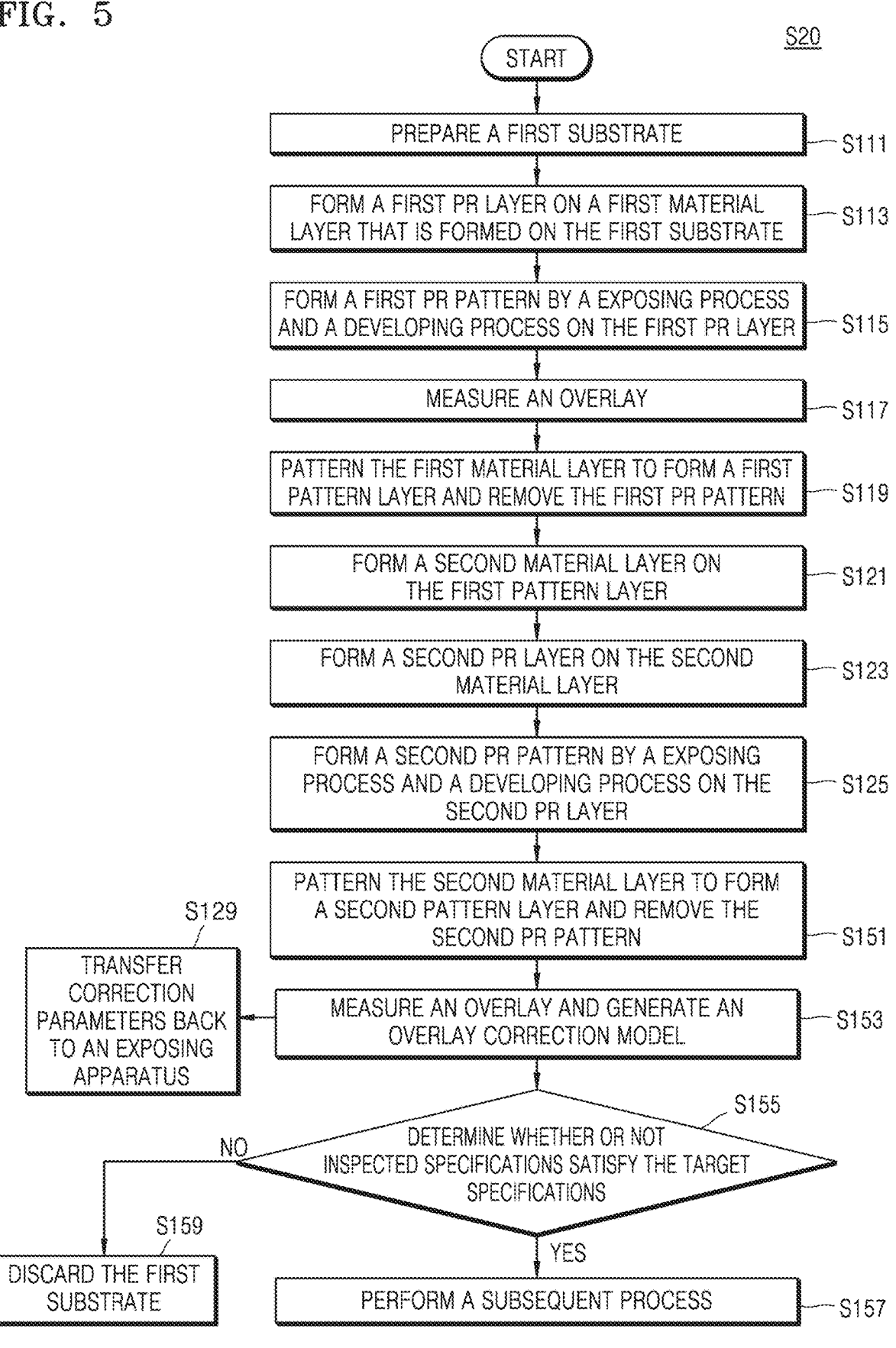
FIG. 5 is a flowchart showing a method of manufacturing a semiconductor device, according to an example embodiment.

FIG. 5 is a flowchart showing a method of manufacturing a semiconductor device S20, according to an example embodiment. Hereinafter, the method of manufacturing a semiconductor device S20 is described with reference to FIG. 5 focusing on differences from the method of semiconductor device S10 described in detail with reference to FIGS. 1 to 4, and the same descriptions as the method of manufacturing a semiconductor device S10 are omitted.

Referring to FIG. 5, operations S111 to S125 may be the same as or substantially similar to those described with reference to FIG. 1.

Referring to FIG. 5 together with FIGS. 2G and 2I, after forming the second PR pattern PP2 in operation S125, the second material layer LY2 may be patterned by an etching process using the second PR pattern PP2 as an etching mask, to thereby form the second pattern layer LY2a, and then, the second PR pattern PP2 may be removed (S151).

After forming the second pattern layer LY2a, an overlay is measured, and an overlay correction model is generated (S153).

In operation S153, the overlay measurement may include an operation of detecting the fourth overlay mark OM4 of the second pattern layer LY2a and the second overlay mark OM2 of the first pattern layer LY1a, and an operation of calculating the relative position between the fourth overlay mark OM4 of the second pattern layer LY2a and the second overlay mark OM2 of the first pattern layer LY1a. The overlay measurement may include an operation of measuring the top intra-field overlay in the top field area of the second pattern layer LY2a, which is an area overlapping with the first top field area TF in FIG. 2H of the second PR layer PR2 or overlapping with the first portion of the first field area F1 in FIG. 2D of the first PR layer PR1, and an operation of measuring the bottom intra-field overlay in the bottom field area of the second pattern layer LY2a, which is an area overlapping with the first bottom field area BF in FIG. 2H of the second PR layer PR2 or the second portion of the first field area F1 in FIG. 2D of the first PR layer PR1. The overlay measurement for the second pattern layer LY2a may be the same as or substantially similar to the overlay measurement described in operation S127 in FIG. 1, except that the overlay measurement is performed by using the fourth overlay mark OM4 of the second pattern layer LY2a instead of the third overlay mark OM3 of the second PR pattern PP2.

In operation S153, an overlay correction model may be determined based on the overlay measurement results. The generating of the overlay correction model may include an operation of generating a top intra-field correction function, an operation of generating a bottom intra-field correction function, an operation of determining a top intra-field correction parameter based on the measured top intra-field overlay and the top intra-field correction function that are measured in the top field areas of the second pattern layer (e.g., by comparing the measured top intra-field overlay with the top intra-field correction function, and an operation of determining a bottom intra-field correction parameter based on the measured bottom intra-field overlay and the bottom intra-field correction function that are measured in the bottom field areas of the second pattern layer (e.g., by comparing the measured bottom intra-field overlay with the bottom intra-field correction function).

The top intra-field correction function may be generated by fitting a polynomial function using the overlay parameters and may be the same as or substantially similar to the first and second top intra-field correction functions TFX and TFY described in detail in operation S127. The top intra-field correction parameter may be determined based on the top intra-field overlay and the top intra-field correction function (e.g., by comparing the top intra-field overlay with the top intra-field correction function). The bottom intra-field correction function may be generated by fitting a polynomial function using the overlay parameters and may be the same as or substantially similar to the first and second bottom intra-field correction function BFX and BFY described in detail in operation S127. The bottom intra-field correction parameter may be determined based on the bottom intra-field overlay and the bottom intra-field correction function (e.g., by comparing the bottom intra-field overlay with the bottom intra-field correction function). The determining of the overlay correction model in operation S153 may be the same as or substantially similar to the determining of the overlay correction model in operation S127 in FIG. 1, so that any detailed descriptions on operation S153 are omitted herein.

The top intra-field correction parameter and the bottom intra-field correction parameter, which are determined in operation S153, may be fed back to the second exposing apparatus (S129). Another exposing process may be performed on a material layer on another semiconductor substrate in the second exposing apparatus based on the fed-back top intra-field correction parameters and bottom intra-field correction parameters.

Next, an inspection process may be performed on the second pattern layer LY2a to determine whether the specifications of the second pattern layer LY2a satisfy target specifications based on the inspection results (S155). For example, the dimensions of the features in the second pattern layer LY2a, the consistency between the second pattern layer LY2a and the lower layer, and defects of the second pattern layer LY2a may be inspected when inspecting the second pattern layer LY2a. In operation S155, when the specifications of the second pattern layer LY2a satisfy the target specifications, a subsequent process may be performed on the first semiconductor substrate W1 (S157). In contrast, in operation S155, when the specifications of the second pattern layer LY2a do not satisfy the target specifications, the first semiconductor substrate W1 may be discarded (S159).

Figure 7:
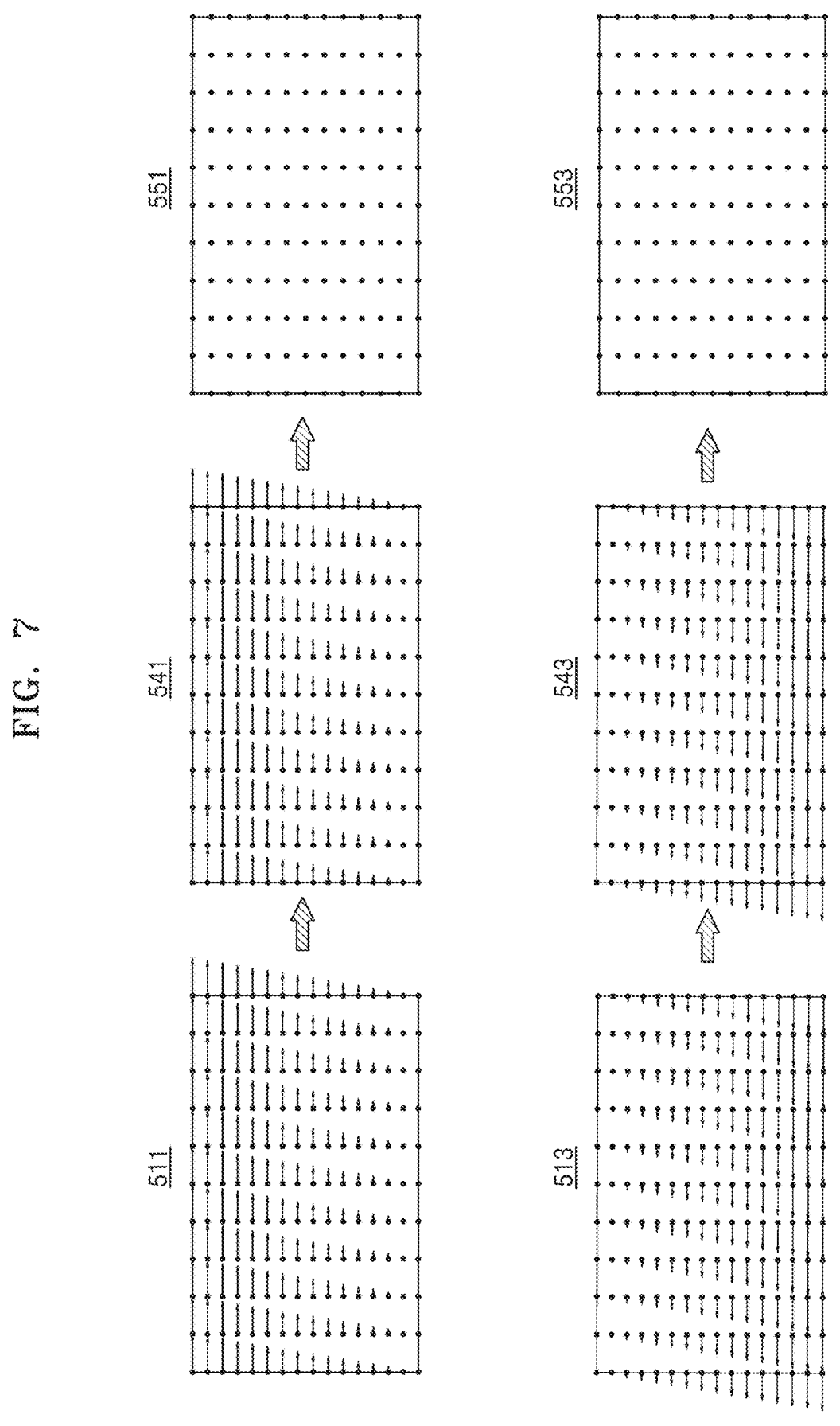

FIG. 6 is a view illustrating a process of processing overlay data in a method of manufacturing a semiconductor device, according to a comparative example. FIG. 7 is a view illustrating a process of processing overlay data in a method of manufacturing a semiconductor device, according to an example embodiment.

FIGS. 6 and 7 shows that the overlay measurement is performed in a structure including a lower layer, which is formed by the first exposing process in the first exposing apparatus, and an upper layer, which is formed by the second exposing process in the second exposing apparatus, and how the top intra-field correction parameter and the bottom intra-field correction parameter, which are fed back to the second exposing apparatus, are determined based on the overlay measurement results. The first exposing process for the lower layer may be performed by using, for example, a DUV radiation beam or a low numerical aperture EUV beam, and the field areas of the lower layer may be exposed by a single exposing step. The second exposing process for the upper layer may be performed by using a high numerical aperture EUV beam, and the top field areas and the bottom field areas of the upper layer may be exposed by a single exposing step, respectively. In FIGS. 6 and 7, the starting point of the arrow may correspond to the coordinates of the corresponding field area, and the size and direction of the arrow may indicate the size and direction of the overlay, respectively. A case that a K5 type overlay occurs in each field area of the bottom layer is shown in FIGS. 6 and 7.

Referring to FIG. 6, reference number 511 denotes data for the top intra-field overlay that is measured in the top field areas of the upper layer, and reference number 513 denotes data for the bottom intra-field overlay that is measured in the bottom field areas of the upper layer. The data 511 for the top intra-field overlay may include an average overlay value, which is an average of the overlay values measured in the top field areas, and the data 513 for the bottom intra-field overlay may include an average overlay value, which is an average of the overlay values measured in the bottom field areas.

Reference number 521 denotes data for the intra-field correction parameters determined by the overlay correction model for the method of manufacturing a semiconductor device according to the comparative example. Reference number 531 denotes data for the difference between the top intra-field overlay and the intra-field correction parameter, and reference number 533 denotes data for the difference between the bottom intra-field overlay and the intra-field correction parameter.

In the method of manufacturing a semiconductor device according to a comparative example, the overlay correction model is generated without distinguishing the top field area and the bottom field area. In generating the overlay correction model, the top intra-field overlay and the bottom intra-field overlay may be integrated to an integrated overlay and the intra-field overlay, which is to be fed back to the exposing apparatus, may be determined based on the integrated overlay and the overlay correction function (e.g., by comparing the integrated overlay with the overlay correction function). As shown in FIG. 6, when the intra-field correction parameter is determined based on the integrated overlay, the overlay is not sufficiently corrected in both of the top field area and the bottom field area, as is verified by the data 531 for the difference between the top intra-field overlay and the intra-field correction parameter and the data 533 for the difference between the bottom intra-field overlay and the intra-field correction parameter.

Referring to FIG. 7, reference number 511 denotes data for the top intra-field overlay measured in the top field areas of the upper layer, and reference number 513 denotes data for the bottom intra-field overlay measured in the bottom field areas of the upper layer. The data 511 for the top intra-field overlay may include an average overlay value, which is the average of the overlay values measured in the top field areas, and the data 513 for the bottom intra-field overlay may include the average overlay value, which is the average overlay value measured in the bottom field areas. Reference number 541 denotes data for the top intra-field correction parameter determined by the overlay correction model according to an example embodiment, reference number 543 denotes data for the bottom intra-field correction parameter determined by the overlay correction model according to an example embodiment, reference number 551 represents the difference between the top intra-field overlay and the top intra-field correction parameter, and reference number 553 represents the difference between the bottom intra-field overlay and the bottom intra-field correction parameter.

According to an example embodiment, in generating the overlay correction model, the top intra-field overlay measured in the top field area and the bottom intra-field overlay measured in the bottom field area may be processed independently from each other. That is, the top intra-field correction parameter may be determined based on the top intra-field overlay, and the bottom intra-field correction parameter may be determined based on the bottom intra-field overlay. In this case, the overlay may be sufficiently corrected in both the top field area and the bottom field area, as is verified by the data 551 for the difference between the top intra-field overlay and the top intra-field correction parameter and the data 553 for the difference between the bottom intra-field overlay and the bottom intra-field correction parameter.

As described with reference to FIGS. 6 and 7, the K5 type overlay may be sufficiently corrected as described in the example embodiments above. Furthermore, when K4, K5, K8, K9, K10, K11, K14, K15, K16, K17, K18 or K19 type overlay occurs on the lower layer, both of the overlay in the top field area and the overlay in the bottom field area may be sufficiently corrected methods of manufacturing a semiconductor device according some example embodiments, whereas both of the overlay in the top field area and the overlay in the bottom field area may not be sufficiently corrected according to the comparative example method of manufacturing a semiconductor device.

Recently, a circuit width of the semiconductor device has become fine and minute and the circuit width may be different in each layer of the semiconductor devices. Accordingly, various circuit patterns having different circuit widths may be formed in various layers of the semiconductor device by a combination of different exposing apparatuses, for example, a combination of a DUV exposing apparatus and an EUV exposing apparatus. However, the DUV exposing apparatus and the EUV exposing apparatus are generally different from the points of the substrate stage, the reticle, the slit, and the optical system as well as the wavelength of light. There have been difficulties in correcting the overlay due to the differences between the DUV exposing apparatus and the EUV exposing apparatus.

However, according to some example embodiments of the present inventive concepts, when the overlay correction is performed on the upper layer that is formed by a high numerical aperture EUV exposing process, the top intra-field overlay and the bottom intra-field overlay may be processed independently from each other, and a subsequent exposing process may be corrected by feeding back the top intra-field correction parameter, which is generated based on the top intra-field overlay, and the bottom intra-field correction parameter, which is generated based on the bottom intra-field overlay, to the exposing apparatus, to thereby improve reliability of the exposing process and reliability of the semiconductor device manufactured by the exposing process.

While the inventive concepts have been particularly shown and described with reference to some example embodiments thereof, it will be understood that various changes in form and details may be made therein without departing from the spirit and scope of the following claims.

What is claimed is:

1. A method of manufacturing a semiconductor device, comprising:

sequentially forming a first material layer and a first photoresist (PR) layer on a first substrate;

forming a first PR pattern on the first material layer by a first exposing process on the first PR layer in a first exposing apparatus, the first exposing process including exposing plurality of first field areas of the first PR layer;

forming a first pattern layer by an etching process on the first material layer using the first PR pattern as an etching mask;

sequentially forming a second material layer and a second PR layer on the first pattern layer;

forming a second PR pattern on the second material layer by a second exposing process on the second PR layer in a second exposing apparatus, the second exposing process including exposing a plurality of first top field areas and a plurality of first bottom field areas of the second PR layer, the first top field areas vertically overlapping first portions of corresponding ones of the first field areas, respectively, and the first bottom field areas vertically overlapping second portions of corresponding ones of the first field areas, respectively;

measuring a first top intra-field overlay for the first top field areas and a first bottom intra-field overlay for the first bottom field areas;

determining a top intra-field correction parameter based on the first top intra-field overlay and a first top intra-field correction function;

determining a bottom intra-field correction parameter based on the first bottom intra-field overlay and a first bottom intra-field correction function;

feeding back the determined top intra-field correction parameter and the determined bottom intra-field correction parameter to the second exposing apparatus;

inspecting the second PR pattern; and selectively reworking the second PR pattern based on an inspection results, to form the semiconductor device.

2. The method of claim 1, wherein the first exposing apparatus is configured to expose the first field areas of the first PR layer to one of a deep ultraviolet (DUV) radiation beam and a relatively low numerical aperture extreme UV (EUV) radiation beam, and the second exposing apparatus is configured to expose the first top field areas and the first bottom field areas of the second PR layer to a relative high aperture EUV radiation beam.

3. The method of claim 1, wherein each of the top field areas has a first reduction ratio in a first direction and a second reduction ratio in a second direction with respect to a photomask of the second exposing apparatus, each of the bottom field areas has the first reduction ratio in the first direction and the second reduction ratio in the second direction with respect to the photomask of the second exposing apparatus, and the first reduction ratio and the second reduction ratio are different from each other.

4. The method of claim 3, wherein each of the first field areas has a third reduction ratio in the first direction and a fourth reduction ratio in the second direction for a photomask of the first exposing apparatus, and the third reduction ratio and the fourth reduction ratio are identical to each other.

5. The method of claim 1, further comprising:

removing the second PR layer;

forming a third PR layer on the second material layer; and performing a third exposing process on top field areas and bottom field areas of the third PR layer in the second exposing apparatus, wherein the third exposing process is performed, on the top field areas of the third PR layer based on the determined top intra-field correction parameter, and on the bottom field areas of the third PR layer based on the determined bottom intra-field correction parameter.

6. The method of claim 5, wherein the performing the third exposing process includes checking a position of a target exposing area of the third PR layer, and the second exposing apparatus is further configured to, perform the third exposing process on the third PR layer based on the determined top intra-field correction parameter in response to the checked position of the target exposing area of the third PR layer being in the top field areas of the third PR layer, and perform the third exposing process on the third PR layer based on the determined bottom intra-field correction parameter in response to the checked position of the target exposing area of the third PR layer being in the bottom field areas of the third PR layer.

7. The method of claim 1, further comprising:

forming a fourth PR layer on a second substrate different from the first substrate; and performing a third exposing process on top field areas and bottom field areas of the fourth PR layer in the second exposing apparatus, wherein the third exposing process is performed, on the top field areas of the fourth PR layer based on the determined top intra-field correction parameter, and on the bottom field areas of the fourth PR layer based on the determined bottom intra-field correction parameter.

8. The method of claim 7, wherein the performing the third exposing process includes checking a position of a target exposing area of the fourth PR layer, and the second exposing apparatus is further configured to, perform the third exposing process on the fourth PR layer based on the determined top intra-field correction parameter in response to the checked position of the target exposing area of the fourth PR layer being in the top field areas of the fourth PR layer, and perform the third exposing process on the fourth PR layer based on the determined bottom intra-field correction parameter in response to the checked position of the target exposing area of the fourth PR layer being in the bottom field areas of the fourth PR layer.

9. The method of claim 1, wherein the measuring includes calculating a relative position between a first overlay mark of the first pattern layer and a second overlay mark of the second PR pattern.

10. The method of claim 1, wherein the first top field areas are arranged in a first line in parallel with a first direction, the first bottom field areas are arranged in a second line in parallel with the first direction, the first line and the second line are spaced apart in a second direction perpendicular to the first direction, and the first top field areas are adjacent to corresponding ones of the first bottom field areas in the second direction, respectively.

11. The method of claim 1, wherein the top intra-field correction function is generated by fitting a first polynomial function based on the top intra-field overlay, and the bottom intra-field correction function is generated by fitting a second polynomial function based on the bottom intra-field overlay.

12. The method of claim 11, wherein the top intra-field correction parameter is a first regression coefficient determined by a first regression analysis for the top intra-field correction function, and the bottom intra-field correction parameter is a second regression coefficient determined by a second regression analysis for the bottom intra-field correction function.

13. The method of claim 11, wherein the top intra-field correction function is represented with an intra-field coordinate in the first top field areas, the bottom intra-field correction function is represented with the intra-field coordinate in the first bottom field areas, a first highest degree of the top intra-field correction function is a third degree, and a second highest degree of the bottom intra-field correction function is a third degree.

14. The method of claim 1, further comprising:

etching the second material layer using the second PR pattern as an etching mask.

15. The method of claim 1, wherein the second exposing apparatus includes, a substrate stage configured to the first substrate, and a mask stage configured to a photomask, and the second exposing apparatus is configured to control the substrate stage and the mask stage based on the top intra-field correction parameter and the bottom intra-field correction parameter.

16. A method of manufacturing a semiconductor device, comprising:

forming a first layer on a first substrate;

sequentially forming a second layer and a photoresist (PR) layer on the first layer;

forming a PR pattern on the second layer by exposing top field areas and bottom field areas of the PR layer in a first exposing apparatus, the top field areas arranged in a first line in parallel with a first direction, the bottom field areas arranged in a second line in parallel with the first direction, the first line and the second line being spaced apart in a second direction perpendicular to the first direction;

measuring a top intra-field overlay for the top field areas and a bottom intra-field overlay for the bottom field areas;

determining a top intra-field correction parameter based on the top intra-field overlay and a bottom intra-field correction parameter based on the bottom intra-field overlay;

feeding back the determined top intra-field correction parameter and the determined bottom intra-field correction parameter to the first exposing apparatus;

inspecting the PR pattern; and selectively reworking the PR pattern based on an inspection result, to form the semiconductor device, wherein each of the top field areas has a first reduction ratio in the first direction and a second reduction ratio in the second direction with respect to a photomask of the first exposing apparatus, each of the bottom field areas has a third reduction ratio in the first direction and a fourth reduction ratio in the second direction with respect to the photomask of the first exposing apparatus, and the first reduction ratio and the second reduction ratio are different from each other and the third reduction ratio and the fourth reduction ratio are different from each other.

17. The method of claim 16, wherein the measuring includes calculating a relative position between a first overlay mark of the first layer and a second overlay mark of the PR pattern.

18. The method of claim 16, wherein the determining includes, fitting a first polynomial function based on the top intra-field overlay to generate a top intra-field correction function, determining the top intra-field correction parameter by a first regression analysis on the top intra-field correction function, fitting a second polynomial function based on the bottom intra-field overlay to generate a bottom intra-field correction function, and determining the bottom intra-field correction parameter by a second regression analysis on the bottom intra-field correction function.

19. A method of manufacturing a semiconductor device, comprising:

sequentially forming a first material layer and photoresist (PR) layer on a first substrate;

forming a first PR pattern by a first exposing process on the first PR layer in a first exposing apparatus, the first exposing process including exposing first field areas of the first PR layer;

forming a first pattern layer by a first etching process on the first material layer using the first PR pattern as an etching mask;

sequentially forming a second material layer and a second PR layer on the first pattern layer;

forming a second PR pattern by a second exposing process on the second PR layer in a second exposing apparatus, the second exposing process including exposing a plurality of first top field areas and a plurality of first bottom field areas of the second PR layer, each of the first top field areas vertically overlapping first portions of corresponding ones of the first field areas, and each of the first bottom field areas vertically overlapping second portions of corresponding ones of the first field areas, respectively;

forming a second pattern layer by a second etching process on the second material layer using the second PR pattern as an etching mask, the second pattern layer including second top field areas vertically overlapping the first top field areas and second bottom field areas vertically overlapping the first bottom field areas;

measuring a top intra-field overlay for the second top field areas and a bottom intra-field overlay for the second bottom field areas;

determining a top intra-field correction parameter based on the top intra-field overlay and a top intra-field correction function;

determining a bottom intra-field parameter based on the bottom intra-field overlay and a bottom intra-field correction function;

feeding back the determined top intra-field correction parameter and the determined bottom intra-field correction parameter to the second exposing apparatus;

inspecting the second PR pattern; and selectively reworking the second PR pattern based on an inspection result, to form the semiconductor device.

20. The method of claim 19, wherein the second exposing apparatus includes, a substrate stage configured to support the first substrate, and a mask stage configured to support a photomask, and the second exposing apparatus is configured to control the substrate stage and the mask stage based on the top intra-field correction parameter and the bottom intra-field correction parameter.

\* \* \* \* \*